US006869478B2

(12) United States Patent
Nakamura et al.

(10) Patent No.: US 6,869,478 B2
(45) Date of Patent: Mar. 22, 2005

(54) METHOD FOR PRODUCING SILICON SINGLE CRYSTAL HAVING NO FLAW

(75) Inventors: Kozo Nakamura, Kanagawa (JP); Toshiaki Saishoji, Kanagawa (JP); Shinji Togawa, Kanagawa (JP); Toshirou Kotooka, Kanagawa (JP); Susumu Maeda, Kanagawa (JP)

(73) Assignee: Komatsu Denshi Kinzoku Kabushiki Kaisha, Kanagawa (JP)

( * ) Notice: Subject to any disclaimer, the term of this patent is extended or adjusted under 35 U.S.C. 154(b) by 51 days.

(21) Appl. No.: 10/239,593

(22) PCT Filed: Mar. 19, 2001

(86) PCT No.: PCT/JP01/02161

§ 371 (c)(1),
(2), (4) Date: Sep. 23, 2002

(87) PCT Pub. No.: WO61/71069

PCT Pub. Date: Sep. 27, 2001

(65) Prior Publication Data

US 2003/0041796 A1 Mar. 6, 2003

(30) Foreign Application Priority Data

Mar. 23, 2000 (JP) ....................................... 2000-083030

(51) Int. Cl.[7] ................................................ C30B 15/20

(52) U.S. Cl. ........................... 117/14; 117/15; 117/201; 117/202; 117/217

(58) Field of Search ............................ 117/14, 15, 201, 117/202, 217

(56) References Cited

FOREIGN PATENT DOCUMENTS

| | | |
|---|---|---|
| JP | 08-330316 | 12/1996 |
| JP | 11-079889 | 3/1999 |
| JP | 11-199386 | 7/1999 |
| JP | 11-199387 | 7/1999 |
| JP | 2000-072590 | 7/2000 |

*Primary Examiner*—Felisa Hiteshew
(74) *Attorney, Agent, or Firm*—Welsh & Katz, Ltd.

(57) ABSTRACT

A method for producing a silicon ingot having no defect over a wide range of region with stability and good reproducibility, wherein when a silicon single crystal (11) is pulled up form a silicon melt (13), the shape of a solid-liquid interface (14) which a boundary between the silicon melt (13) and the silicon single crystal (11) and the temperature distribution on the side face (11*b*) of a single crystal under being pulled up are appropriately controlled.

5 Claims, 27 Drawing Sheets

DEFECT-FREE PORTION
DISLOCATION CLUSTER
OSF RING PORTION
VOID DEFECT PORTION
CRYSTAL LENGTH (mm)
DISTANCE FROM CENTER (mm)
0
100
200
300
400
500
600
700
800
20
40
60
80

METHOD FOR PRODUCING SILICON SINGLE CRYSTAL HAVING NO FLAW

TECHNICAL FIELD

This invention relates to a method for producing defect-free crystals (defect-free silicon single crystals), and to a silicon single crystal produced by this method.

BACKGROUND ART

As semiconductor devices have been finer and more highly integrated in recent years, there has been an increasing need for silicon wafers of higher quality. This also underscores the need to reduce crystal defects that occur in the course of producing silicon single crystals.

[Defects Contained in Single Crystals and Behavior thereof]

It has been understood that the following three types of crystal defect are commonly included in single crystals and related to deterioration of the performances of a device.

[1] Void defects thought to occur through the agglomeration of vacancies

[2] Oxidation induced stacking faults (OSF)

[3] Dislocation clusters thought to occur through the agglomeration of interstitial silicon It is known that the way these defects occur varies as follows with the growth conditions.

[i] When the growth rate is high, single crystals have excessive vacancies and therefore prone to the occurrence of only void defects.

[ii] If the growth rate is reduced, ring-like OSF occur around the outer periphery of the crystals, and void defects are present on the inside of the OSF portion.

[iii] If the growth rate is further reduced, the radius of the ring-like OSF decreases, dislocation clusters are produced on the outer side of the ring-like OSF portion, and void defects are present on the inner side of the OSF portion.

If the growth rate is reduced further yet, dislocation clusters are produced throughout the crystal.

It is recognized that the above phenomena occur because a crystal changes from a state of excess vacancy to a state of excess interstitial silicon as the growth rate is lowered, and this change is understood to commence from the outer peripheral of the crystal.

[Defect-Free Crystals (Defect-Free Silicon Single Crystals)]

As mentioned above, as device performances become more sophisticated, there is an increasing need to reduce the crystal defects that occur in the course of producing silicon single crystals. With this in mind, there have been studies into the possibility of producing defect-free crystals (perfect crystals), and a method for producing defect-free silicon single crystals has been proposed in Japanese Laid-Open Patent Application H8-330316 (hereinafter referred to as "Publication 1").

Publication 1 states that a defect-free region was found where none of the above-mentioned three types of defect is present between the ring-like OSF portion and the region where dislocation clusters occur. This defect-free region is understood to correspond to a transition region from an excess vacancy state to an excess interstitial silicon state, and correspond to a neutral state that does not reach an excess amount at which any of the defects occur.

Publication 1 also states a proposal of a growth method by which this neutral state is attained throughout an entire crystal. With this proposed method, this neutral state can be attained throughout an entire crystal by pulling up the crystal such that the ratio expressed by V/G is kept within a range of 0.20 to 0.22 $mm^2/°$ C. min where V is the crystal pull-up rate (mm/min)and G is the average temperature gradient within the crystal in the axial direction between the melting point of silicon and 1300° C. (° C./mm).

If G is constant in the radial direction, then when G=3.0° C./mm, for example, the pull-up rate V should be controlled to 0.63±0.03 mm/min. This is not impossible in an industrial setting. Still, this only refers to the maximum permissible range, and is not actually practical. This is because if G varies, and is not uniform in the radial direction, the permissible range becomes exceedingly small. For example, the permissible range drops to zero once the change in G in the radial direction reaches 10%. This means that slight decreases the uniformity of G make it essentially impossible to produce defect-free crystals (perfect crystals).

Moreover, since G is usually not constant in the radial direction, it is entirely conceivable that the change in G in the radial direction will indeed reach 10%. Because of this, with the method proposed in Publication 1, even if crystals are pulled up at the same pull-up rate, heater output and so forth, defect-free crystals will sometimes be obtained and sometimes not, meaning that the production of defect-free crystals will be extremely unstable.

Furthermore, the following two problems are encountered with the proposal in Publication 1.

[1] G (the average temperature gradient within a crystal in the axial direction) is hard to evaluate and difficult to predict.

[2] G varies during pull-up.

Specifically, factors that cause G to vary during pull-up include changes in the thermal balance resulting from a change in the length of the crystal, changes in the thermal balance resulting from a change in the relative positions of the crucible and heater, and changes in the amount of melt, and it is difficult to ascertain and control these.

Also, whereas the growth rate V is a controllable parameter, the evaluation and prediction of G are very difficult, and change dynamically. Accordingly, a great deal of trial and error are inevitable in the specific implementation of this invention. That is, the relation between the specific settable parameters and the resulting G is unclear, so no specific means is known for achieving this end. Further, even the value of V/G, at which a neutral state is said to be obtained, can vary by two times depending on the research facility, and can even be considered as an uncertain value.

Japanese Laid-Open Patent Application H11-199386 (hereinafter referred to as "Publication 2") acknowledges the industrial difficulty in producing crystals that will in only this neutral state (method in Publication 1), and proposes a method for producing crystals substantially close to being free of defects, although permitting an OSF portion to remain in just an extremely small region at the crystal center. Publication 2 states that it was believed that the producing conditions under which this state is obtained are determined by V/G, and proposes the following as conditions for getting the entire crystal into this region.

[a] The in-plane average G is less than 3° C./mm, and is less than 1.0° C./mm between Gedge and Gcenter. (Gedge is the average axial temperature gradient on the crystal side face side, and Gcenter is the average axial temperature gradient on the crystal center side. $V_{OSFclose}$ is the pull-up rate at which OSF rings disappear when the pull-up rate is reduced.)

[b] V is controlled to $V_{OSFclose}$±0.02 mm/min, and the average V is controlled to $V_{OSFclose}$±0.01 mm/min.

[c] The single crystal pull-up is performed with a magnetic field applied, this magnetic field being a horizontal magnetic field, and the magnetic field strength being 2000 G or greater.

Keeping the difference between Gedge and Gcenter to less than 1.0° C./mm, controlling V to $V_{OSFclose}$±0.02 mm/min, and controlling the average V to $V_{OSFclose}$±0.01 mm/min, as in Publication 2, are within the ranges proposed in Publication 1, and what is presented as new information is that it is easier to obtain defect-free crystals when there is a low temperature gradient, with the in-plane average G being less than 3° C./mm, and that the application of a magnetic field is effective.

Japanese Laid-Open Patent Application H11-199387 (hereinafter referred to as "Publication 3") proposes a method for producing defect-free crystals containing no OSF portion. Publication 3 states that there are two types of neutral region, and noting that there is a defect-free region in which vacancies are predominant and a defect-free region in which interstitial silicon is predominant, the proposal was made of a method for producing defect-free crystals in which interstitial silicon is predominant.

As to the conditions for pulling up defect-free crystals, the in-plane change in G is adjusted so that (Gmax−Gmin)/Gmin will be less than 20%. This is also within the proposed range given in Publication 1, and no specific method is disclosed. The value of G given in Publication 3 is determined by heat transfer analysis (FEMAG), and not only is the absolute value of G not known, it is not even certain whether the distribution trend in the radial direction itself corresponds to actual crystals.

Japanese Laid-Open Patent Application H11-79889 (hereinafter referred to as "Publication 4") proposes a method for producing crystals so that just the neutral state is produced. This method involves flating of the shape at the solid-liquid interface, and it is proposed that the pulling be such that the height of the solid-liquid interface will be no more than ±5 mm with respect to the average value. In this case, G is uniform, and Gedge and Gcenter can be kept under 0.5° C./mm. Applying a magnetic field is an effect way to obtain a flat solid-liquid interface shape such as this, and a horizontal magnetic field of 2000 Gauss or greater is said to be best.

The new finding of this proposal is that the shape of the solid-liquid interface is identified as a factor. The given G value, however, is found by heat transfer analysis (FEMAG), just as in Publication 3. However, just because the solid-liquid interface is flat does not automatically mean that G will be uniform, so not only is the absolute value of G not known, it is not even certain whether the distribution trend in the radial direction itself corresponds to actual crystals.

As discussed above, with prior proposals, crystals free of defects could be obtained if the growth rate V and the axial temperature gradient G near the solid-liquid interface were appropriately controlled. However, as described above, in addition to the fact that G is dynamic, changing from moment to moment while a crystal is being pulled up, it is also extremely difficult to evaluate or predict this value accurately. Actually, even the value of V/G, at which a neutral state is said to be obtained, can vary by two times depending on the research facility, and can even be considered an uncertain value.

Thus, whereas the growth rate V is a controllable parameter, the evaluation and prediction of G are very difficult, and change dynamically. Therefore, a great deal of trial and error were inevitable in the specific implementation of the inventions according to the above-mentioned conventional technology.

Also, the relation between the specific settable parameters and the resulting G is uncertain, so no specific means is known for determining the proper G in all publications related to the aforementioned prior technology.

DISCLOSURE OF THE INVENTION

The present invention was made in light of the above problems, and it is an object thereof to ascertain the specific conditions necessary to obtain defect-free crystals stably and with good reproducibility, and to provide a method for producing a silicon ingot having a broad defect-free region stably and with good reproducibility.

In order to achieve the stated object, the present invention is characterized in that defect-free crystals are produced stably and with good reproducibility by suitably adjusting the relation between the shape of the solid-liquid interface and the temperature distribution on the side face of a single crystal being pulled up.

[Basic Concept of the Invention, and Effect of the Solid-Liquid Interface Shape on the Formation of the Defect-Free Crystals]

The fact discovered by the inventors of the present application that the shape of the solid-liquid interface is closely related to the formation of defect-free crystals, and that this "shape of the solid-liquid interface" is a parameter that can actually be controlled, contributed greatly to the inventors' being able to make the present invention.

The phrase "shape of the solid-liquid interface" as used here is the portion that becomes the interface when a silicon melt solidifies and forms silicon single crystals. As shown in FIG. 25, the solid-liquid interface 14 can be defined as the boundary between the silicon single crystal 11 and the silicon melt 13. This solid-liquid interface 14 may protrude upward (FIG. 25A) or downward (FIG. 25B). Depending on the case, the boundary may also be flat (FIG. 25C), or it may be wavy (FIG. 25D).

The fact that the shape of this solid-liquid interface 14 is closely related to the convection of the silicon melt 13 is another discovery by the inventors, and since it is possible to control the convection of the silicon melt 13, as a result it is also possible to control the shape of the solid-liquid interface 14.

The following is a more detailed description of the information newly obtained by the inventors. The reason it is difficult to evaluate and predict G (the average temperature gradient within a crystal in the axial direction) is that G is greatly affected by the shape of the solid-liquid interface. Because the shape of the solid-liquid interface is governed in large measure by the melt convection, the distribution of G cannot be accurately predicted unless the prediction is correct also on the melt convection. Thus, the precision at which G can be predicted by heat transfer simulation that does not take melt convection into account will naturally be low.

For example, results of evaluating G that do not include the convection effect cannot be used in the setting of conditions that require high-precision evaluation, as in adjusting the V/G ratio to between 0.20 and 0.22 $mm^2$/° C.min. However, a major obstacle in performing this setting is that there is not as yet a technique for predicting a melt convection with a crystal pull-up apparatus wherein the size is on the current industrial level. With the present invention, it is possible to conduct an evaluation of G that includes the convection effect, and control the V/G ratio at extremely high precision, by establishing a technique for predicting the effect of a melt convection.

Also, G is dynamic, changing from moment to moment, and examples of factors that can change G during pull-up include changes in the thermal balance resulting from a change in the length of the crystal, changes in the thermal balance resulting from a change in the relative positions of the crucible and heater, and changes in the amount of melt. The inventors have hit upon the conclusion that the reason G fluctuates as a result of these changes is that these changes cause the convection of a silicon melt to change, and the shape of the solid-liquid interface to change as well.

Therefore, with the present invention, basically the shape of the solid-liquid interface is adjusted by controlling parameters related to the convection of the silicon melt 13, whereby defect-free crystals are obtained stably and exactly.

To this end, as shown in FIG. 26, the hot zone must be controlled so that the "height of the solid-liquid interface" defined as the height h of the solid-liquid interface 14 at the center line 11*a* of a crystal 11 (that is, the height h of the solid-liquid interface at the crystal center) will be correlated with the temperature gradient in the pulling direction on the side face 11*b* of the crystal 11. (This will later be described in further detailed manner.)

Incidentally, as shown in FIG. 27, the basic structure of the hot zone in a standard CZ furnace includes a crucible 21 that holds the silicon melt 13 and self-rotates, a heater 22 that heats this crucible 21, a heat shield 23 that surrounds the single crystal 11 being pulled up from the silicon melt 13 while rotating, and adjusts the amount of heat radiated to this single crystal 11, side face temperature adjusting means 24 for adjusting the temperature of the side face 11*b* of the single crystal 11, and a solenoid 26 for applying a magnetic field to the silicon melt 13.

The heat shield 23 is generally made from a carbon material, and adjusts the temperature of the side face 11*b* of the single crystal 11 by blocking heat radiated from the silicon melt 13 and so forth, while the side face temperature adjusting means 24, which is disposed surrounding the single crystal 11 just as is the heat shield 23, is made of a material that actively absorbs heat or performs heating, such as a cooler or a heater. Also, as shown in FIG. 27, the heater 22 preferably comprises a side heater 22*a* and a bottom heater 22*b*.

The control and adjustment of the convection of the silicon melt for implementing the present invention, and in turn the control and adjustment of the height of the solid-liquid interface (h in FIG. 26), can be performed by adjusting the rotational speed of the crucible per unit of time, adjusting the rotational speed of the crystal per unit of time, and applying a magnetic field and adjusting the strength of this applied field.

In general, the height of the solid-liquid interface will increase whether the rotational speed of the crucible per unit of time is increased, the rotational speed of the crystal per unit of time is increased, or a magnetic field is applied. In order to produce defect-free crystals according to the present invention, the temperature gradient of the side face 11*b* of the single crystal 11 must be increased as the height of the solid-liquid interface rises.

[Conventional Recognition of the Effect of the Solid-Liquid Interface Shape and Melt Convection]

The control of the shape of the solid-liquid interface and the control of the convection of the silicon melt have not been touched upon whatsoever in the above-mentioned conventional technology. The following is all there is on this topic.

First, in Publications 2 and 3, G (the average temperature gradient within a crystal in the axial direction) is evaluated by FEMAG (F. Dupret, P. Nicodeme, Y. Ryckmans, P. Wouters, and M. J. Crochet, Int. J. Heat Mass Transfer, 33, 1849 (1990)). This evaluation procedure merely involves evaluating the environment of thermal radiation, conduction and transfer within the hot zone, and the effect of the melt convection is not considered. However, as described above, since G is actually governed in large measure by the melt flow state, not only is the G indicated by this procedure not the absolute value, but it is not even certain whether the distribution trend in the radial direction itself corresponds to actual crystals.

Therefore, the distribution of the actual G (average temperature gradient within a crystal in the axial direction) in an actual crystal used in their experiment and the G claimed in the Claims section can hardly be said to match up in a perfect correlation, and if taken to the extreme, it might even be said that the two are not related in any way at all.

This same situation applies to the inventions according to Publications 1 and 4, in which the effect of melt convection and solid-liquid interface shape is either not taken into account at all, or substantially not considered, so when G is tracked precisely, it can hardly be said that the actual G distribution matches up perfectly with the G indicated in the Claims section. Consequently, when the invention according to Publication 1 is implemented, for example, defect-free crystals cannot be obtained stably even after adjustment to the V and V/G indicated in the Claims.

In this respect, since Publication 1, for instance, gives essentially no thought to the considerable effect that the solid-liquid interface shape has on G, the examples of producing defect-free crystals given therein are producing examples for whatever shape the solid-liquid interface happened to have, and do not indicate the optimal conditions. Also, since the production was performed in a state in which the solid-liquid interface shape was not fixed, this means that the examples of successful production of defect-free crystals also included a considerable number of accidental factors.

Incidentally, a method for producing crystals that results in only a neutral state has been proposed in Japanese Laid-Open Patent Application H10-330713 (invention previously submitted by this company). The conditions therein are that V/G is from 0.16 to 0.18 $mm^2/°$ C.min and the ratio of Gedge/Gcenter is 1.10, but at the time the patent application was submitted for this invention, melt convection had not yet been given that much thought.

[Principle of the Present Invention]

Research on the part of the inventors has revealed that the factors which determine the axial temperature gradient G of a crystal are the shape of the solid-liquid interface and the temperature distribution on the side face of the crystal. Since the temperature at the solid-liquid interface is the melting point, if these two factors are determined, then the boundary conditions for determining the temperature of the crystal will be determined, and the steady state temperature distribution inside the crystal will also be uniquely determined. In view of this, the occurrence of crystal defects is controlled in the present invention by using these two factors as operating parameters.

<Shape of the Solid-Liquid Interface>

The shape of the solid-liquid interface can be controlled as desired by controlling the parameters that vary the melt convection. The temperature distribution on the outer side face of the crystal can also be controlled as desired through the structure of the hot zone.

In view of this, the inventors sought the conditions under which defect-free crystals would be readily obtained by controlling the shape of the solid-liquid interface and the temperature distribution on the outer side face of the crystal.

First they examined the relation between G and the shape of the solid-liquid interface by heat transfer analysis. FIG. 1 illustrates an example of the solid-liquid interface shape near the growth rate at which the OSF rings disappear. As shown in FIG. 1, at such a low growth rate, the location of the solid-liquid interface generally becomes gull-shaped (along with FIG. 1, also see the solid-liquid interface 14 in FIG. 26B), so that the interface is convex on the melt side, but depending on the state of the melt convection, it can also be convex on the crystal side.

Next, as shown in FIG. 2, the solid-liquid interface shape is patterned on the basis of the shape in FIG. 1, and the virtual interface shape is set such that the difference between the height of the solid-liquid interface at the crystal center and the solid-liquid interface height at the outer periphery of the crystal (hereinafter referred to as the "height of the solid-liquid interface") is varied in 5 mm intervals from −20 mm to +20 mm. (As described above, illustrated schematically, as shown in FIG. 26, the "height of the solid-liquid interface" is defined as the height h of the solid-liquid interface 14 at the center line 11*a* of the crystal 11.)

<Temperature Distribution on Crystal Side Face>

For the temperature distribution on the crystal side face, the temperature distribution shown in FIG. 3 was set by patterning the crystal side face temperature distribution obtained from global heat transfer analysis. ("Crystal side face" refers to the side face 11*b* of the crystal 11 shown in FIG. 26.) The set temperature distribution T(X) is given by the following Formula 1.

$$T(X)K=1685K-1.78X+aX(X-400)^2 \quad (1)$$

where X is the distance (mm) from the solid-liquid interface, and T(X) is the absolute temperature on the crystal side face at the distance Xmm from the solid-liquid interface.

Assuming that the temperature gradient at the solid-liquid interface in this formula be $G_0=-(dT(X)/dX)_{x=0}$, then $G_0=1.78+1.6\times10^5a$ is obtained, where a was set to give the value of $G_0$ for the crystal side face in 0.5° C./mm intervals from 1.5 to 5.0° C./mm, the length of the crystal was assumed to be 400 mm (cylindrical), and the crystal diameter to be 210 mm.

FIG. 4 is a graph of the contour lines of G at the crystal center when the horizontal axis is the height of the solid-liquid interface, and the vertical axis is the G of the crystal side face (the temperature gradient in the crystal pull-up direction; hereinafter G will be used in this meaning in describing the present invention).

<Height of the Solid-Liquid Interface and G at the Crystal Side Face and the Crystal Center>

It can be seen that G at the crystal center (the temperature gradient in the crystal pull-up direction; the same applies hereinafter) varies greatly with the height of the solid-liquid interface. It must be noted here that G refers to the temperature gradient from the melting point up to 1350° C. at both the crystal side face and the crystal center, and is not $G_0$.

FIG. 5 shows the ratio between the temperature gradient G on the outer side face of the crystal and the temperature gradient at the crystal center, calculated on the basis of the above calculation results. As shown in FIG. 5, it can be seen that the conditions under which the ratio between the temperature gradient G on the outer side face of the crystal and the temperature gradient at the crystal center is close to 1 and G is uniform vary with the shape of the solid-liquid interface. Furthermore, it can also be seen that to obtain a uniform G, the greater is the height of the solid-liquid interface, the greater the temperature gradient must be on the side face.

It is stated in Publication 4 that G is uniform when the shape of the solid-liquid interface is flat, but if we refer to these calculation results (FIG. 5) we see that this condition only holds true when G on the crystal side face is small. Also, reference to these calculation results reveals that when the height h of the solid-liquid interface is great, a uniform G is obtained even with a high temperature gradient. In regard to this, Publication 2 states that neutral crystals are easier to obtain at a low temperature gradient at which the in-plane average G is less than 3° C./mm. However, it can be seen that as long as the height of the interface is set high, a uniform G will be obtained even at a high temperature gradient.

<Conditions under which Defect-Free Crystals are Obtained>

The inventors turned their attention to this relationship and searched for conditions that would readily yield defect-free crystals. The height of the solid-liquid interface (h in FIG. 26) was adjusted by means of the rotational speed of the crucible per unit of time, the rotational speed of the crystal per unit of time, whether or not a magnetic field was applied, and the strength of this magnetic field. The temperature gradient on the crystal side face (11*b* in FIG. 26) was adjusted by means of the height of the heat shield (such as the heat shield 23 in FIG. 27) surrounding the crystal from the liquid surface.

The height of the solid-liquid interface was evaluated by slicing a pulled-up crystal vertically including the crystal axis to obtain a sheet-form sample, and then observing the growth striation by X-ray topography.

The temperature gradient on the crystal side face was determined by global heat transfer analysis. It was mentioned in the previous section that the evaluation of G by global heat transfer analysis has poor precision because the effect of the melt convection cannot be accurately evaluated. However, this is because the location of the solid-liquid interface varies with the melt convection. In principle, the solid-liquid interface height at the ends of the crystal side face is almost unchanged by convection. Therefore, the reliability of this value is better than that of G in the crystal interior.

Under pull-up conditions including a crystal diameter of 210 mm and a crucible diameter of 22 inches, the distribution of defect type was examined to see how it varies with the combination of conditions of G on the crystal side face and the solid-liquid interface height. Crystals were grown while the growth rate was steadily lowered. The distribution of defect type at various locations in the crystals was evaluated by Secco etching and X-ray topography after heat treatment, and by copper decoration.

TABLE 1

| Sample | Solid-liquid interface height | Temperature gradient on crystal side face | Magnetic field application |
|---|---|---|---|
| Crystal in FIG. 6 | −5.7 mm | 2.1° C./mm | none |
| Crystal in FIG. 7 | +7.0 mm | 2.7° C./mm | horizontal magnetic field 2000 Gauss |
| Crystal in FIG. 8 | +14.7 mm | 2.82° C./mm | horizontal magnetic field 3000 Gauss |

FIGS. 6, 7, and 8 show examples of evaluation results for the above three crystals. FIGS. 6, 7, and 8 illustrate the regions in which each type of defect is present, where the horizontal axis is the growth rate, and the vertical axis is the location in the radial direction of the crystal.

The growth rate range in which defect-free crystals can be obtained is, of course, between the minimum rate Vosf,min in the radial direction of the transition rate between the OSF region and the defect-free region, and the maximum rate Vdis,max in the radial direction of the transition rate between the defect-free region and the dislocation cluster region. Vosf,min and Vdis,max as defined here are indicated by the broken lines in FIGS. 7 and 8.

Here, if $\Delta V$=Vosfmin−Vdis,max, then defect-free crystals will be obtained only when $\Delta V$ is positive. In addition, when $\Delta V$ is defined in this way, it is also the permissible range for pull-up rate, and the larger this value is, the better suited it will be to industrial production. Furthermore, the larger is the average value V of Vosf,min and Vdis,max, the more quickly the single crystals can be pulled up, so the larger is the average value V, the better is the productivity.

FIG. 9 shows contour lines for $\Delta V$, where the horizontal axis is the height of the solid-liquid interface, and the vertical axis is G on the crystal side face. Here, the growth of defect-free crystals is possible if $\Delta V$ is positive, that is, in terms of FIG. 9, only within the range indicated by the hatching in FIG. 9. As for the industrially controllable range, the range indicated by the cross-hatching in FIG. 9 ($\Delta V$>0.01 mm/min) is preferable.

Meanwhile, FIG. 10 shows the contour lines for the average value V of Vosf,min and Vdis,max, where the horizontal axis is the height of the solid-liquid interface, and the vertical axis is G on the crystal side face. It can be seen from FIGS. 9 and 10 that the higher the location of the solid-liquid interface, and the higher the temperature gradient on the crystal side face (hereinafter referred to as high temperature gradient conditions), the faster the defect-free crystals can be pulled up.

<Discrepancies Between Conventional Findings and Findings of the Inventors>

Findings according to prior inventions have held that defect-free crystals will not be obtained unless G is uniform. With this in mind, we compared the range over which defect-free crystals are obtained in FIG. 9 with the uniformity of the temperature gradient in FIG. 5. This revealed that the conditions for good uniformity do not correspond perfectly to the range over which defect-free crystals are obtained. In other words, under conditions comprising a low temperature gradient on the crystal side face (hereinafter referred to simply as low temperature gradient conditions), defect-free crystals will be obtained even if G is not very uniform at all. This finding is in contrast to the findings according to prior inventions.

Furthermore, past findings have held that there exists a certain V/G ratio at which defect-free crystals are formed. This has been treated as if it were a matter of course because according to the Voronkov theory (V. V. Voronkov, *J. Crystal Growth,* Vol. 59, p. 625, 1982), the growth conditions in which there is a neutral state, with the vacancy and interstitial silicon concentrations being equal, are determined by V/G.

On the other hand, though, there is an extraordinary amount of variance in the reported values for the V/G critical value among various research facilities. This is probably because none of these reports looked at the effect that the shape of the solid-liquid interface has on G.

In view of this, we found the G value that takes into account the shape effect of the solid-liquid interface, for the examples shown in FIGS. 6, 7, and 8, and conducted an evaluation using the V/G for the defect region. In this G evaluation method, a measured solid-liquid interface shape was used in the calculations, and the temperature distribution on the crystal side face was found by heat transfer calculation by setting the distribution found by global heat transfer analysis.

These results are given in FIGS. 11, 12, and 13. It can be seen from the graphs that the V/G at which a defect-free region occurs varies greatly with the height of the solid-liquid interface. It can also be seen from FIGS. 11, 12, and 13 that the V/G value at which defect-free crystals are obtained varies with the solid-liquid interface shape.

The V/G values reported in Publication 1 corresponded to the values in FIG. 11 in the case of the crystal in FIG. 6, in which the solid-liquid interface was lowered down. Since the width of V passing through the wafer plane in FIG. 6 is extremely narrow, it can be seen that it would be extremely difficult to control all the wafer planes so as to be defect-free. This underscores the fact that it would be quite difficult to produce defect-free crystals on the basis of the report in Publication 1.

<Voronkov Theory and the Present Invention>

While it cannot be predicted from the Voronkov theory that the critical V/G varies with the shape of the solid-liquid interface, the theory does corroborate this phenomenon somewhat. We will now give a brief description of how the Voronkov theory corroborates that the critical V/G varies in relation to the shape of the solid-liquid interface.

According to the Voronkov theory, at the solid-liquid interface of silicon, vacancies and interstitial silicon are in about the same concentration as point defects in thermal equilibrium, with vacancies thought to be present in slightly greater quantity. Interstitial silicon is said to have a larger diffusion coefficient at high temperatures. Since vacancies and interstitial silicon rapidly lower the concentrations of each other through a pair annihilation reaction, a concentration gradient is produced, and inflow through diffusion occurs at the solid-liquid interface. At this point, the interstitial silicon, which has a larger diffusion coefficient, enters in a larger quantity, so under low-speed pull-up conditions in which much diffusion time is provided, an inversion occurs in the concentration relationship, with interstitial silicon becoming dominant. On the other hand, under high-speed pull-up, not much diffusion time is provided, and only a pair annihilation reaction occurs, so the vacancies that were dominant in the first place remain dominant in this model.

Voronkov arrived at the fact that the growth conditions which result in a neutral state are described by a specific V/G on the premise of the one-dimensional diffusion of point defects. Specifically, this corresponds to a scenario in which the solid-liquid interface is flat and the temperature distribution is uniform in the radial direction. Actual crystals, though, can not described by a one-dimensional model. According to the thinking of Voronkov, since the concentration gradient of point defects occurs in the temperature gradient direction, a strong concentration gradient is generated perpendicular to the solid-liquid interface.

In other words, when the solid-liquid interface is not flat, the diffusion of interstitial silicon occurs not in the crystal axial direction, but perpendicular to the solid-liquid interface, so it may be that the shape of the solid-liquid interface also has two-dimensional diffusion effects, such as the concentration of interstitial silicon on the crystal center side, or diffusion outward from the crystal. Therefore, our experimental results, which indicate that "the critical V/G at which a neutral state is obtained is dependent on the shape of the solid-liquid interface," can be qualitatively corroborated by Voronkov's theory of interstitial silicon diffusion.

[Disclosure of the Invention]

The present invention, which was conceived in light of the above situation, is specifically described as follows.

(1) A method for producing defect-free crystals, wherein the shape of the solid-liquid interface between a silicon melt and a silicon single crystal is taken into account in the pulling of a silicon single crystal from a silicon melt by CZ (Czochralski) method.

In the context of the essence of the present invention, "A method for producing defect-free crystals, wherein the height of the solid-liquid interface between a silicon melt and a silicon single crystal, which is the height of the solid-liquid interface at the crystal center, is taken into account in the pulling of a silicon single crystal from a silicon melt by CZ method" and "A method for producing defect-free crystals, wherein the convection of a silicon melt is taken into account in the pulling of a silicon single crystal from the silicon melt by CZ method" can be viewed as being substantially the same as (1) above.

(2) A method for producing a silicon ingot by pulling up the silicon single crystal from the silicon melt by CZ method by adjusting the shape of the solid-liquid interface, which is the boundary between a silicon melt and a silicon single crystal, and the temperature distribution on the side face of the silicon single crystal, thereby producing a silicon ingot including a defect-free region.

(3) The method according to (2), wherein the shape of the solid-liquid interface is adjusted by adjusting the height of the solid-liquid interface at the crystal center, and the temperature distribution on the side face of the silicon single crystal is adjusted by adjusting the temperature gradient in the pulling direction in the periphery of the crystal.

(4) The method according to (3), wherein the height of the solid-liquid interface at the crystal center is 10 mm or higher.

(5) The method according to (3), wherein the adjustment of the height of the solid-liquid interface at the crystal center is accomplished by one or more ways selected from the group consisting of adjusting the strength of the magnetic field applied to the silicon melt, adjusting the rotational speed per unit of time of the crucible containing the silicon melt, and adjusting the rotational speed per unit of time of the silicon single crystal.

(6) The method according to (5), wherein the strength of the magnetic field is 2500 Gauss or greater.

(7) A method for increasing the production efficiency of defect-free crystals by setting the height of the crystal center portion of the solid-liquid interface between a silicon melt and a silicon single crystal to 10 mm or greater and increasing the rate at which the silicon single crystal is pulled up in the pulling of a silicon single crystal from a silicon melt by CZ method. "The height of the crystal center portion of the solid-liquid interface" is defined the same as "the height of the solid-liquid interface at the crystal center."

(8) An apparatus for producing a silicon ingot by pulling up a silicon single crystal from a silicon melt by CZ method, wherein the silicon single crystal is pulled up such that the height of the solid-liquid interface at the crystal center portion of the solid-liquid interface between a silicon melt and a silicon single crystal, and the temperature gradient on the side face of the silicon single crystal fall within the region indicated by the hatched region in FIG. 9.

However, this apparatus results in excluding the situations where a silicon single crystal is pulled up under any of the following single crystal pull-up conditions I to III:

(I) the ratio expressed by V/G is controlled to be from 0.20 to 0.22 mm$^2$/° C.min, where V is the crystal pull-up rate (mm/min) and G is the average temperature gradient within the crystal in the axial direction between the melting point of silicon and 1300° C. (° C./mm), (II) the in-plane average G is less than 3° C./mm, less than 1.0° C./mm between Gedge and Gcenter, V is controlled to $V_{OSFclose}$±0.02 mm/min, the average V is controlled to $V_{OSFclose}$±0.01 mm/min, and in a horizontal magnetic field the applied magnetic field strength is 2000 G or greater(Gedge is the average axial temperature gradient on the crystal side face side; Gcenter is the average axial temperature gradient on the crystal center side; and $V_{OSFclose}$ is the pull-up rate at which OSF rings disappear when the pull-up rate is reduced.)

(III) the V/G value between the crystal center location and a location up to the crystal outer periphery is from 0.16 to 0.18 mm$^2$/° C. ·min, and Gouter/Gcenter ≦1.10, where V is the crystal pull-up rate (mm/min), G is the average temperature gradient within the crystal in the axial direction between the melting point of silicon and 1350° C. (° C./mm), Gouter is the G value on the outer side face of the crystal, and Gcenter is the Gvalue at the crystal center.

In regard to the region indicated by the hatching in FIG. 9, it is actually preferable if the height of the solid-liquid interface and the temperature gradient on the crystal side face are controlled so as to be within the region indicated by the cross-hatching in FIG. 9. When production efficiency of a silicon ingot or a silicon wafer is considered, the data in FIG. 10 are also taken into account. In a typical embodiment, the data in FIG. 9 and the data in FIG. 10 are both stored in the memory of the silicon ingot producing apparatus, and the apparatus reads out this data as needed to set the pull-up conditions.

(9) A defect-free crystal produced by pulling at a rate of 0.40 mm/min or greater (and especially at a rate of 0.45 mm/min or greater). The defect-free crystals are preferably low-oxygen defect-free crystals, and as shown in an embodiment given below, the pull-up rate can be set between 0.56 and 0.49 mm/min.

(10) A silicon ingot with a diameter of 200 mm or greater, and 55% (ratio of length to overall silicon ingot length) or greater (and preferably 70% or greater) of which is a region in which the entire wafer plane is defect-free. Producing a large-diameter silicon ingot having such a broad defect-free region is novel because it was impossible with the methods for producing defect-free crystals according to conventional technology, and this is also encompassed by the scope of the present invention. The phrase "a region in which the entire wafer plane is defect-free" refers to a region in which an entire plane that is cut from an ingot is free of defects.

(11) A group of silicon ingots wherein five or more (and preferably ten or more) silicon ingots are produced continuously, and made up solely of silicon ingots with a diameter of 200 mm or greater, and 50% (ratio of length to overall silicon ingot length)or greater (more preferably 55% or greater) of which is a region in which the entire wafer plane is defect-free.

With the methods for producing defect-free crystals according to conventional technology, because it was so difficult to produce defect-free crystals stably, large-diameter silicon ingots 55% or greater of which is a region in which the entire wafer plane is defect-free could not be produced stably (such as five or more ingots continuously). However, this is possible with the present invention.

(12) A silicon ingot with an oxygen concentration of 24 ppma or less and a diameter of 200 mm or greater, and 40% (ratio of length to overall silicon ingot length)or greater of which is a region in which the entire wafer plane is defect-free.

The following is another method for producing a silicon ingot corresponding to the silicon ingot producing apparatus described in (8) above.

(13) A method for producing a silicon ingot by pulling up a silicon single crystal from a silicon melt by CZ method, wherein the silicon single crystal is pulled up such that the height of the solid-liquid interface at the crystal center portion of the solid-liquid interface between a silicon melt and a silicon single crystal, and the temperature gradient on the side face of the silicon single crystal fall within the region indicated by the hatched region in FIG. 9.

It can also be seen that one aspect of the present invention is an extremely effective method for finding the optimal conditions for producing defect-free crystals. Therefore, the present invention encompasses in its scope the following as a concept thereof, and the acts of analyzing the shape of a solid-liquid interface by using an existing electrothermal analysis system or the like, and seeking the optimal conditions for producing defect-free crystals are all encompassed in the scope of the present invention.

(14) A method for finding the optimal conditions for producing defect-free crystals by monitoring the shape of the solid-liquid interface between a silicon melt and a silicon single crystal in the pulling of a silicon single crystal up from a silicon melt by CZ method.

<(9) to (12) and Conventional Technology>

As to an ingot in which entire wafer planes are present as a defect-free region, M. Hourai, H. Nishikawa, T. Tanaka, S. Umeno, E. Asayama, T. Nomachi, and G. Kellty have disclosed in "Semiconductor Silicon," Electrochemical Society Proceedings PV 98-1, 1998, p. 453 (hereinafter referred to as Publication 5) an ingot in which 73% (the value obtained judging from the photograph provided) of the entire length of a 6-inch (150-mm) crystal is such a defect-free region. Also, J. G. Park, G. S. Lee, J. M. Park, S. M. Chou, and H. K. Chung have reported in "Defect in Silicon III," Electrochemical Society Proceedings PV 99-1, 1999, p. 324 (hereinafter referred to as Publication 6) that, regarding an ingot of a diameter of 200 mm, 600 mm (that is, 50% of the total length) out of the entire 1200 mm length of a crystalis defect-free.

Therefore, it is clear that the "silicon ingot with a diameter of 200 mm or greater and 55% (ratio of length to overall silicon ingot length) or greater (and preferably 70% or greater) of which is a region in which the entire wafer plane is defect-free" mentioned in (10) above is novel.

Also, even if a silicon ingot with a diameter of 200 mm or greater and 50% or greater of which is a region in which the entire wafer plane is defect-free can be produced with the method in Publication 6, such an ingot cannot be produced stably, so it is also clear that the "group of five or more (and preferably ten or more) silicon ingots produced continuously, said silicon ingot group being made up solely of silicon ingots with a diameter of 200 mm or greater and 50% (ratio of length to overall silicon ingot length)or greater (more preferably at 55% or greater) of which is a region in which the entire wafer plane is defect-free" mentioned in (11) above is novel.

In the above-mentioned Publications 5 and 6, there is no disclosure made of an oxygen concentration of 24 ppma or less, so the "silicon ingot with an oxygen concentration of 24 ppma or less and a diameter of 200 mm or greater, and 40% (ratio of length to overall silicon ingot length) or greater of which is a region in which the entire wafer plane is defect-free" mentioned in (12) above is also clearly novel.

Incidentally, no mention of the crystal pull-up rate is made in the above-mentioned Publication 6, while Publication 5 states that a crystal is pulled up at 0.40 mm/min. Nevertheless, the crystal pulled up at 0.40 mm/min in Publication 5 is 6 inches (150 mm), not 200 mm. Also, Publication 4 reports that a defect-free state was formed at a crystal pull-up rate of 0.55 mm/min. However, when the pull-up is performed at this rate, only part of the crystal is in a defect-free state, and an ingot in which entire wafer planes are present as a defect-free region was not produced at this pull-up rate. The same holds true for the report by M. Iida, W. Kusaki, M. Tamatsuka, E. Iino, M. Kimura, and S. Muraoka ("Defect in Silicon III," Electrochemical Society Proceedings PV 99-1, 1999, p. 499 (Publication 7)) that a defect-free state was formed at a crystal pull-up rate of 0.53 mm/min.

Therefore, it is also clear that the "defect-free crystal produced by pulling at a rate of 0.40 mm/min or greater (and especially at a rate of 0.45 mm/min or greater)" mentioned in (9) above is novel.

The term "defect-free crystal (perfect crystal)" means a crystal in which neither void defects, nor oxidation induced stacking faults (OSF), or dislocation clusters are present. The term "defect-free region (perfect crystal region)" or "region free of defects" means a region in a crystal in which neither void defects, oxidation induced stacking faults (OSF), nor dislocation clusters are present.

The solid-liquid interface shape can be adjusted by adjusting the rotational speed of the crystal per unit of time, adjusting the rotational speed of the crucible per unit of time, adjusting magnetic field strength and direction, adjusting the bottom heater output, or a combination of these, while the axial temperature gradient (G) on the crystal side face can be adjusted by adjusting the distance between the heat shield and the silicon melt, installing a cooler or heater that surrounds the crystals being pulled up, adjusting the bottom heater output, or a combination of these.

BEST MODE FOR CARRYING OUT THE INVENTION

As discussed above, defect-free crystals are obtained by controlling the solid-liquid interface height and the temperature gradient on the crystal side face to the proper state. It is well known that the temperature gradient on the crystal side face can be adjusted by adjusting the radiation environment to which the crystal side face are subjected. As to the adjustment of the solid-liquid interface height, however, a numerical evaluation of the situation is difficult. Nevertheless, the factors that control this, and the qualitative tendencies of the action thereof, are clear, and the right control conditions can be found by a certain amount of trial and error.

Figure 14:
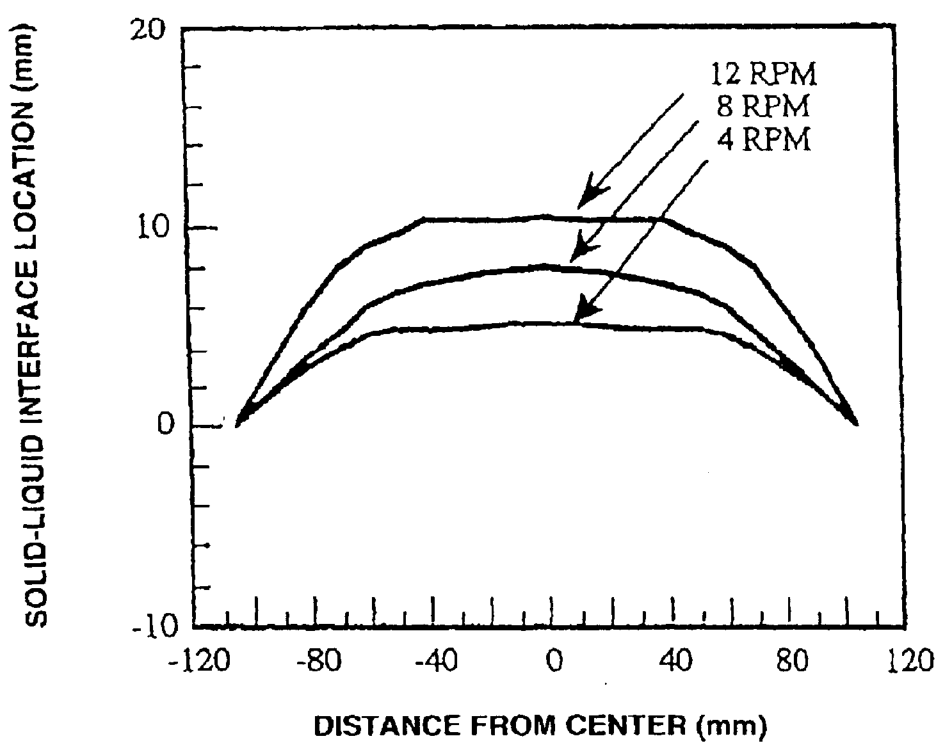
FIG. 14 is a graph of the effect that crystal rotational speed has on the shape of the solid-liquid interface.
Figure 15:
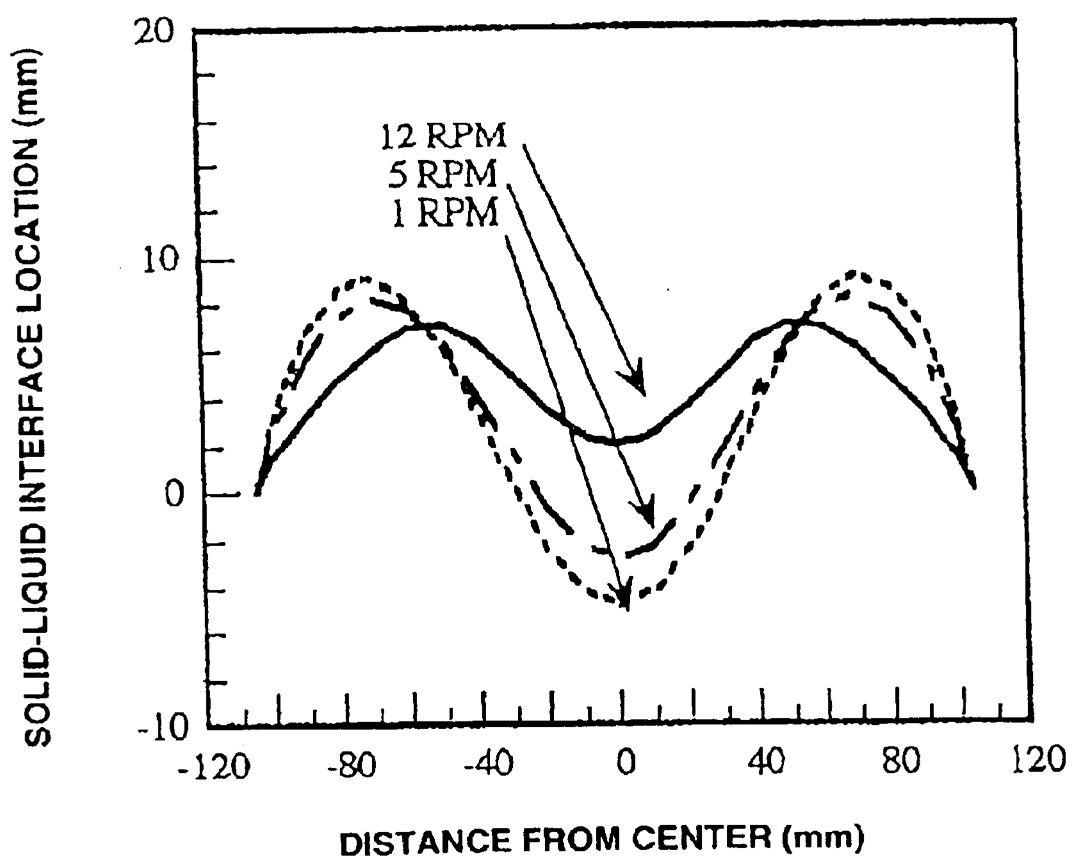
FIG. 15 is a graph of the effect that crucible rotational speed has on the shape of the solid-liquid interface.
Figure 16:
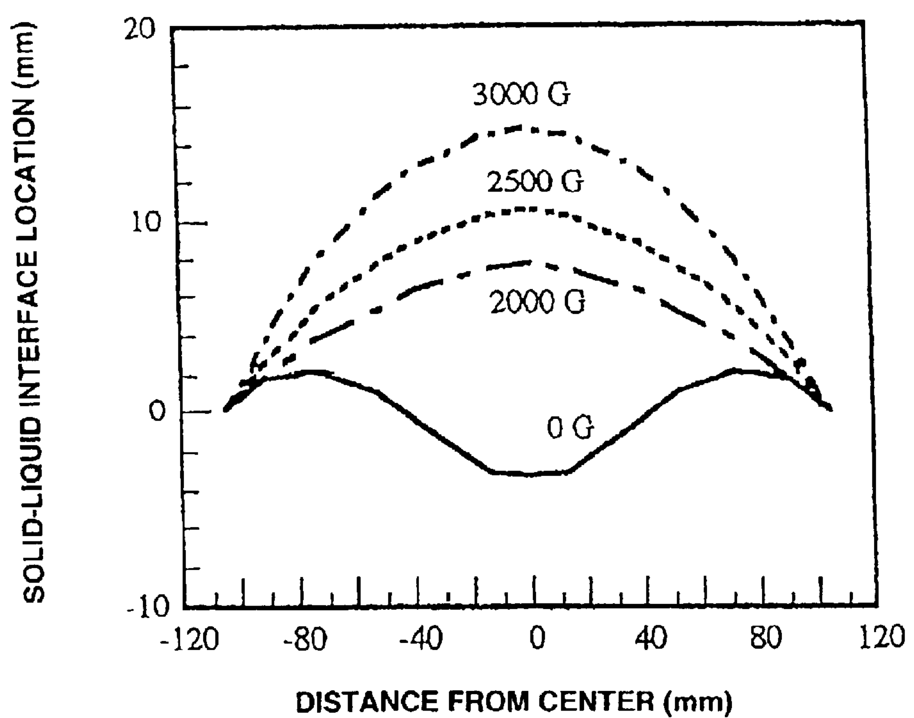
FIG. 16 is a graph of the effect that the strength of the horizontal magnetic field has on the shape of the solid-liquid interface.

Examples of controlling the height of the solid-liquid interface will now be given. FIGS. 14, 15, and 16 show how the height of the solid-liquid interface is related to the crystal rotational speed per unit of time, the crucible rotational speed per unit of time, and the strength of the applied lateral magnetic field, respectively. It can be seen from the drawings that the more the crystal rotational speed per unit of time is increased, the more the crucible rotational speed per unit of time is increased, and the more the strength of the applied lateral magnetic field is increased, the more the solid-liquid interface rises.

The height of the solid-liquid interface is believed to be determined by a thermal balance equation (Formula 2 below) called Stefan’s condition.

$$L\rho V=KlGl-KsGs \qquad (2)$$

where L is the latent heat of solidification, ρ is the density, V is the growth rate, Kl and Ks are the thermal conductivity of the melt and the crystals, and Gl and Gs are the temperature gradient of the melt and the crystals.

At the solid-liquid interface, the above equation must always be satisfied for the energy balance, and it is believed that the solid-liquid interface always moves to the location where the above equation is satisfied. In other words, it can be seen that the temperature gradient Gl of the melt strongly governs the location of the solid-liquid interface. The temperature distribution within the melt is greatly affected by the melt convection, so the location of the solid-liquid interface can be controlled by manipulating the factors that govern convection.

An increase in the crystal rotational speed induces a melt hoisting flow through crystal rotation, so a high-temperature melt approaches the solid-liquid interface of the crystal and increases Gl, and therefore leads to a rise in the solid-liquid interface location. An increase in crucible rotation is known to have the effect of suppressing natural convection within the crucible, and augments the effect of the convection induced relatively by crystal rotation, and therefore leads to a higher interface. Application of a magnetic field suppresses convection within the melt and therefore suppresses heat transfer through convection. Accordingly, the temperature gradient GL within the melt increases, leading to a higher solid-liquid interface. The above is described very well qualitatively. Quantitative prediction requires a simulation of the melt convection including turbulence, and entails some difficulty, but the qualitative tendency is clear and can therefore be controlled by a certain amount of trial and error.

[Standard Procedure for Setting Growth Conditions for Defect-Free Crystals According to the Present Invention]

The standard procedure for setting the conditions for growing the defect-free crystals according to the present invention is given below.

Step 1: First, referring to FIGS. 9 and 10, the desired growth rate and the target for the permissible range of growth rate (ΔV) are determined.

Step 2: The hot zone structure with which the set G on the crystal side face is determined by global heat transfer analysis.

Step 3: A crystal is pulled up in the hot zone determined in Step 2, while the pull-up rate is gradually reduced.

Step 4: The pulled crystal is sliced vertically, and the distribution of defect type is evaluated. The pull-up rate at which a neutral region is created, and the height of the solid-liquid interface near this pull-up rate are also evaluated.

Step 5: The evaluation results from Step 4 are referenced to FIG. 9, a means for adjusting the height of the solid-liquid interface and G on the crystal side face is worked out, and Step 3 is conducted once more.

As discussed above, examples of means for adjusting the height of the solid-liquid interface include adjusting the rotational speed of the crucible per unit of time, adjusting the rotational speed of the crystal per unit of time, and applying a magnetic field of a specific strength. The temperature gradient on the crystal side face can be adjusted by adjusting the radiation environment to which the crystal side face are subjected. The growth conditions under which defect-free crystals will be obtained can be easily found by manipulation such as this. In searching for the right growth conditions, it should go without saying that design modifications can be worked in as needed by a person skilled in the art.

[Embodiments]

Embodiments of the present invention will now be given.

With the pulling conditions set at a crystal diameter of 210 mm and a crucible diameter of 22 inches, the change in the distribution of defect type was examined by combination of conditions of solid-liquid interface height and G on the crystal side face. The distribution of defect type at various locations in the crystal was evaluated by copper decoration method and X-ray topography following heat treatment and Secco etching. The results for three different growth conditions are given below as examples.

TABLE 2

Figure 1:
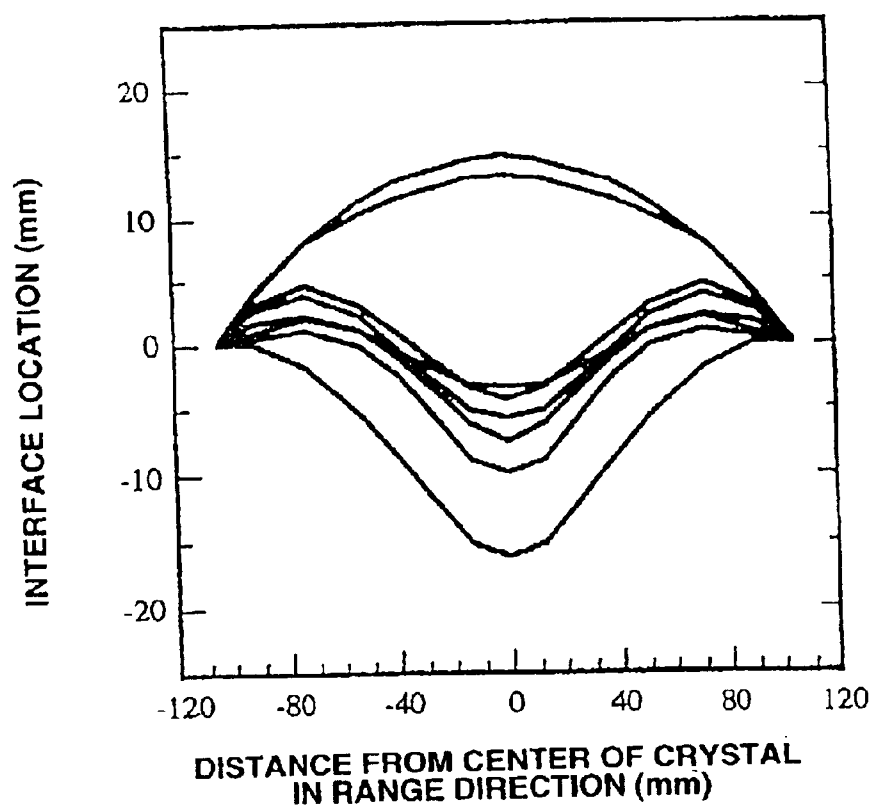
FIG. 1 illustrates an example of the shape of a solid-liquid interface at a growth rate in the neighborhood of the growth rate at which the OSF rings disappear.
Figure 2:
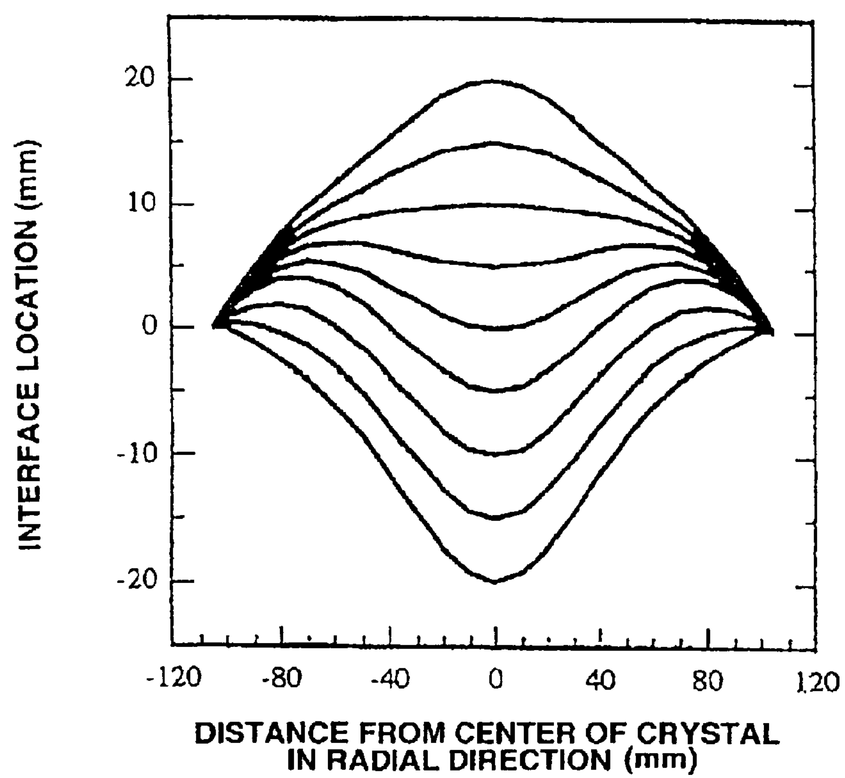
FIG. 2 illustrates a set of interface shapes preset for calculation.
Figure 3:
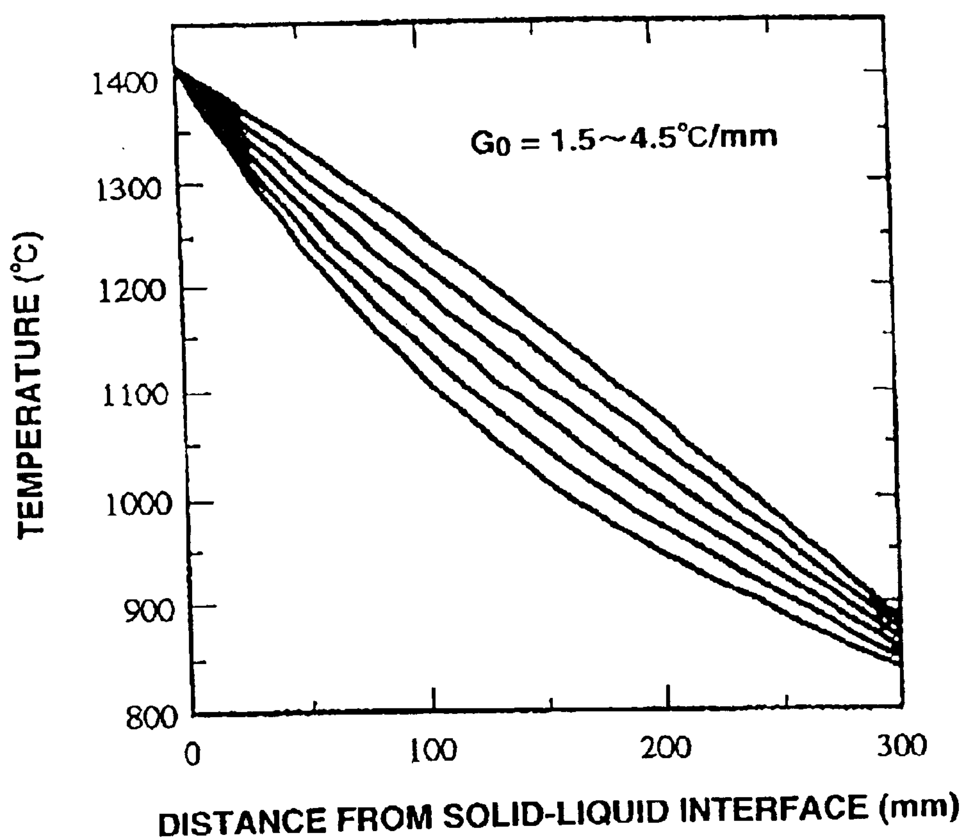
FIG. 3 is a graph of the temperature distribution on the crystal side face.
Figure 4:
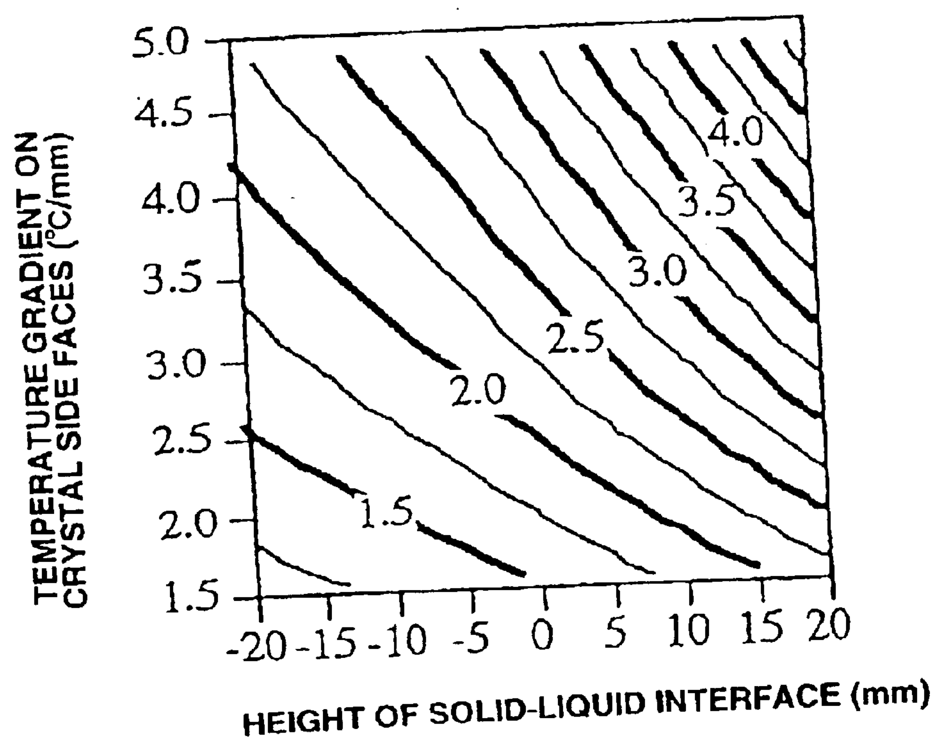
FIG. 4 is a graph of the contour lines for the temperature gradient G at the crystal center, where the horizontal axis is the height of the solid-liquid interface and the vertical axis is G on the crystal side face.
Figure 5:
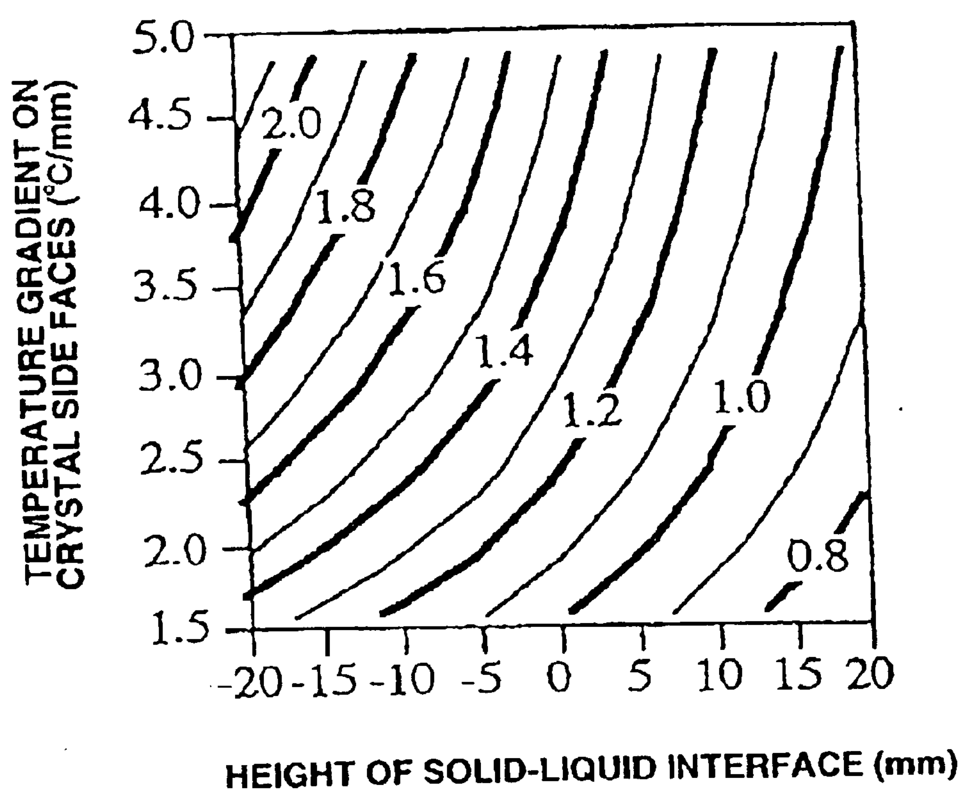
FIG. 5 is a graph of the contour lines for the ratio (Gedge/Gcenter) between the temperature gradient G on the outer side face of the crystal and the temperature gradient at the crystal center, where the horizontal axis is the height of the solid-liquid interface and the vertical axis is G on the crystal side face.
Figure 6:
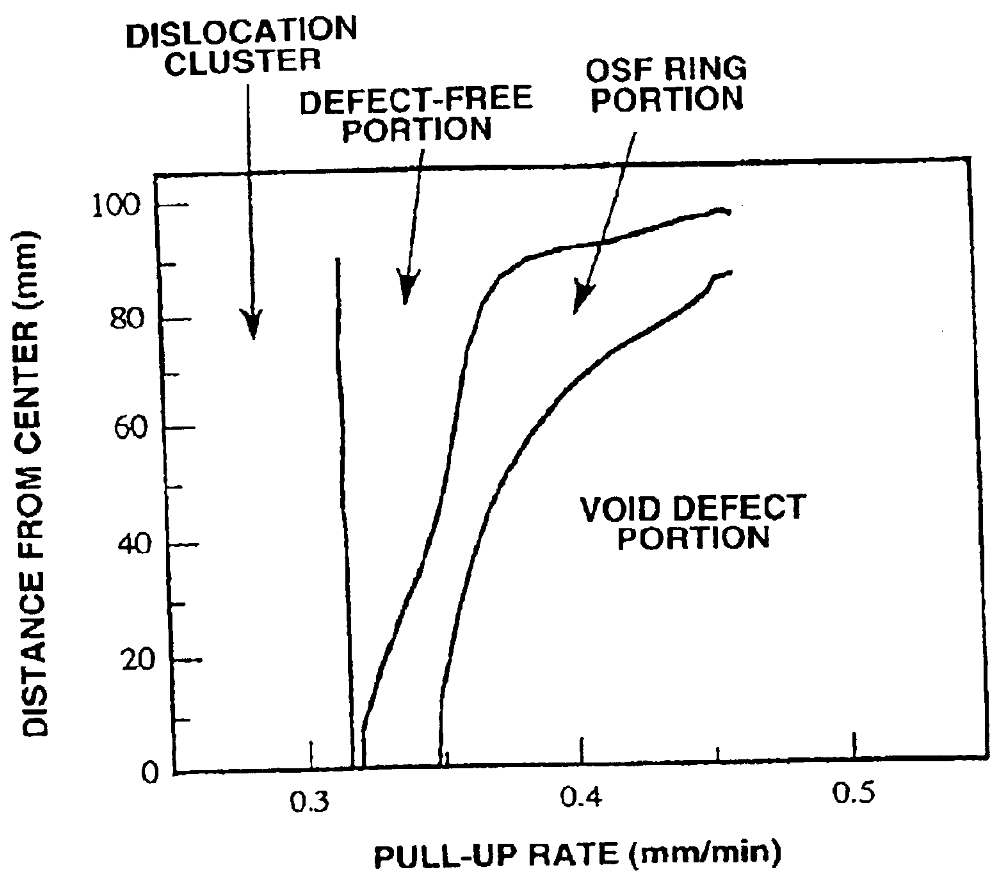
FIG. 6 is a graph of the relation between the pull-up rate and the region in which each type of defect is present in the radial direction.
Figure 7:
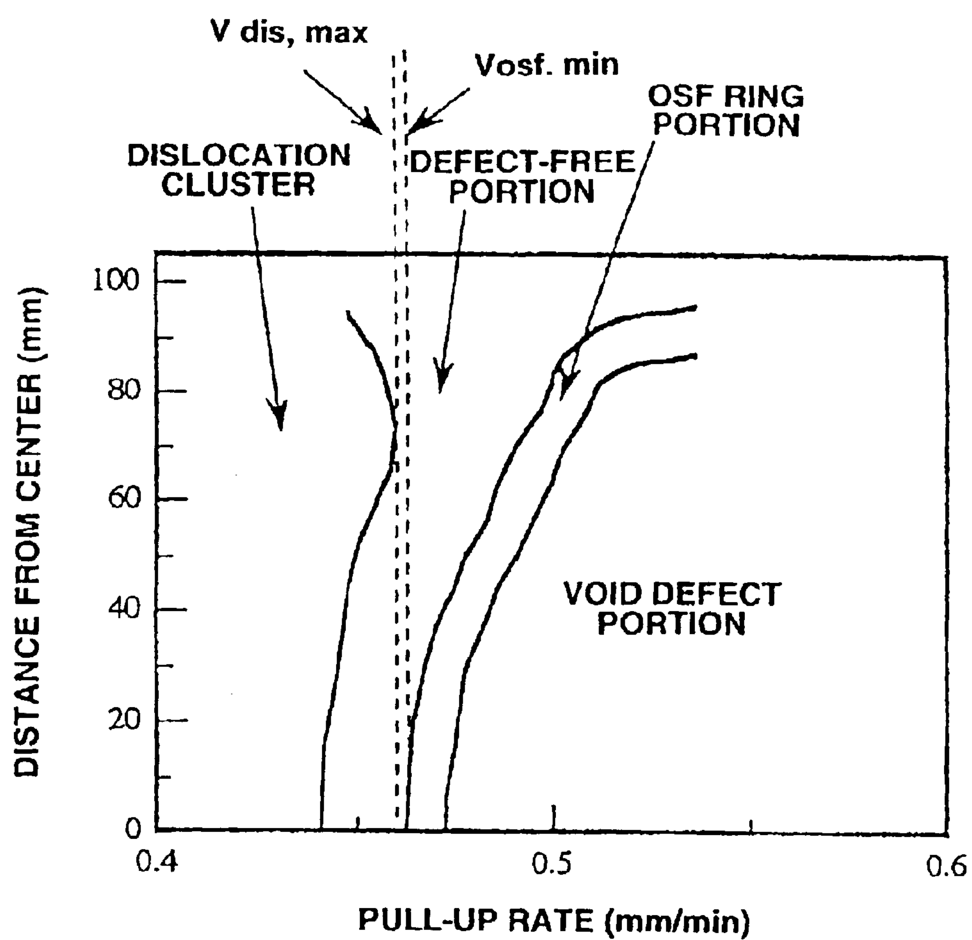
FIG. 7 is a graph of the relation between the pull-up rate and the region in which each type of defect is present in the radial direction.
Figure 8:
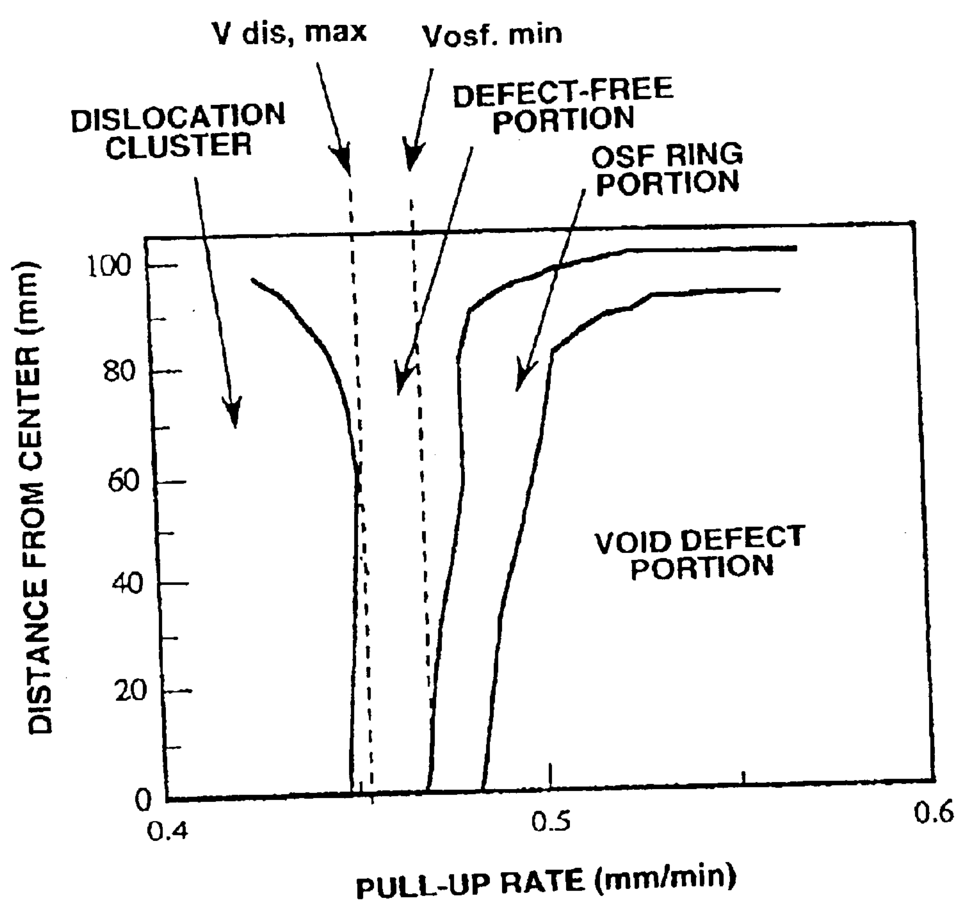
FIG. 8 is a graph of the relation between the pull-up rate and the region in which each type of defect is present in the radial direction.

| Sample | Solid-liquid interface height | Temperature gradient on crystal side face | Magnetic field application |
|---|---|---|---|
| Crystal in FIG. 6 | −5.7 mm | 2.1° C./mm | none |
| Crystal in FIG. 7 | +7.0 mm | 2.7° C./mm | horizontal magnetic field 2000 Gauss |
| Crystal in FIG. 8 | +14.7 mm | 2.82° C./mm | horizontal magnetic field 3000 Gauss |

The oxygen concentration was from 24 to 32 ppma (old ASTM, F 121-79). FIGS. 6, 7, and 8 illustrate the regions in which each type of defect is present, where the horizontal axis is the growth rate, and the vertical axis is the location in the radial direction of the crystal.

The growth rate range in which defect-free crystals can be obtained is between the minimum rate Vosf,min in the radial direction of the transition rate between the OSF region and the defect-free region, and the maximum rate Vdis,max in the radial direction of the transition rate between the defect-free region and the dislocation cluster region. If ΔV=Vosf, min−Vdis,max, then defect-free crystals will be obtained only when ΔV is positive. ΔV is also the permissible range for pull-up rate, and the larger this value is, the better suited it will be to industrial production, and the larger is the average value V of Vosf,min and Vdis,max, the better is the productivity.

TABLE 3

| Sample | Vosf, min | Vdis, max | V |
|---|---|---|---|
| Crystal in FIG. 6 | 0.320 mm/min | 0.317 mm/min | 0.003 mm/min |
| Crystal in FIG. 7 | 0.462 mm/min | 0.460 mm/min | 0.002 mm/min |
| Crystal in FIG. 8 | 0.482 mm/min | 0.452 mm/min | 0.030 mm/min |

Figure 9:
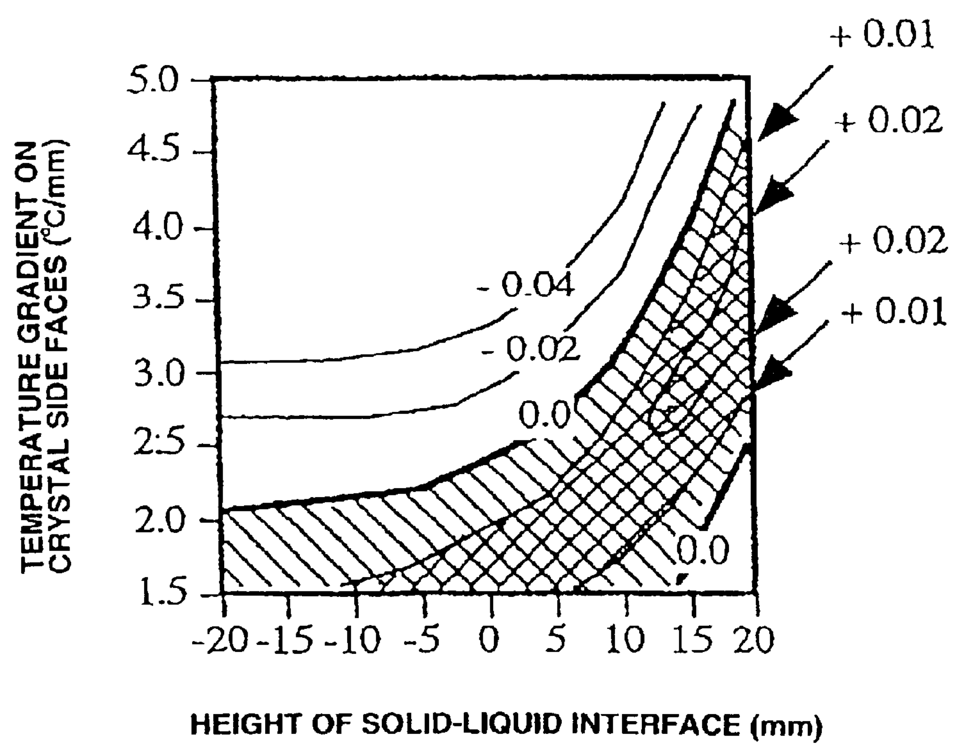
FIG. 9 is a graph of the contour lines for Vosf,min−Vdis, max, where the horizontal axis is the height of the solid-liquid interface, and the vertical axis is G on the crystal side face (the hatched portion is the region where Vosf,min−Vdis,max >0, and indicates a region where defect-free crystals can be produced, while the cross-hatched portion indicates a region that is especially suited to industrial production)
Figure 10:
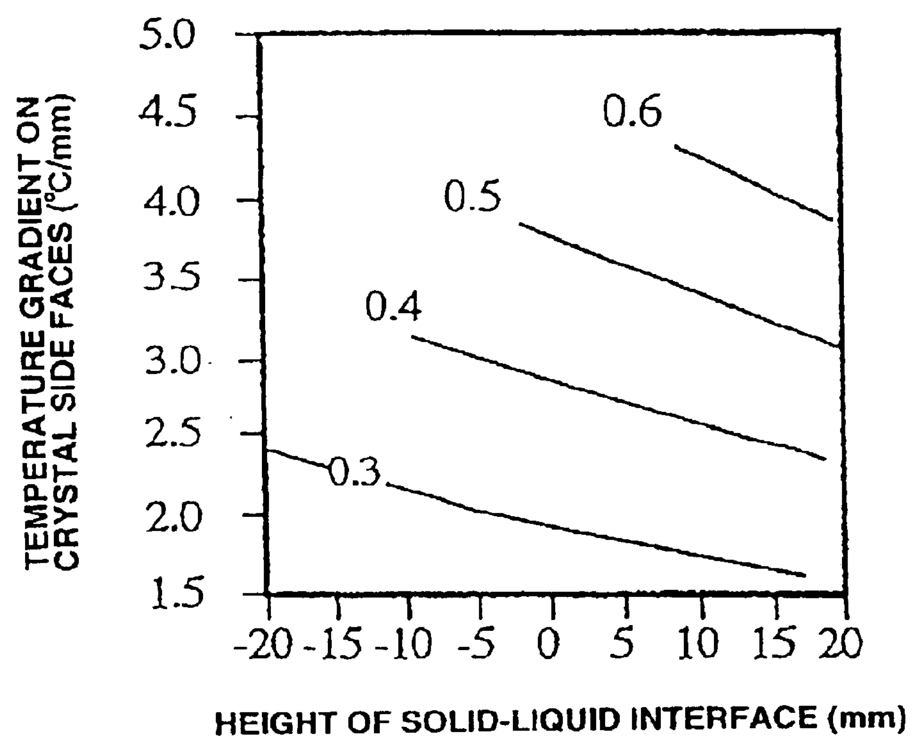
FIG. 10 is a graph of the contour lines for the average value of Vosfmin−Vdis,max, where the horizontal axis is the height of the solid-liquid interface, and the vertical axis is G on the crystal side face.
Figure 11:
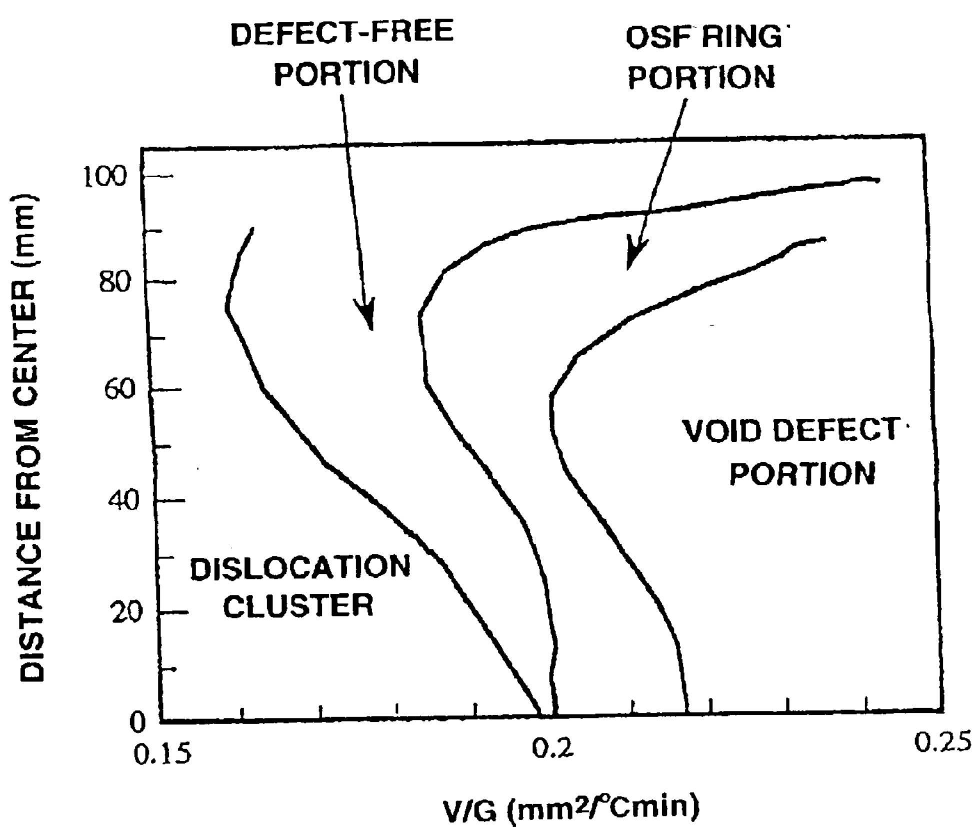
FIG. 11 is a graph of the relation between V/G and the region in which each type of defect is present in the radial direction, for the crystal in FIG. 6.
Figure 12:
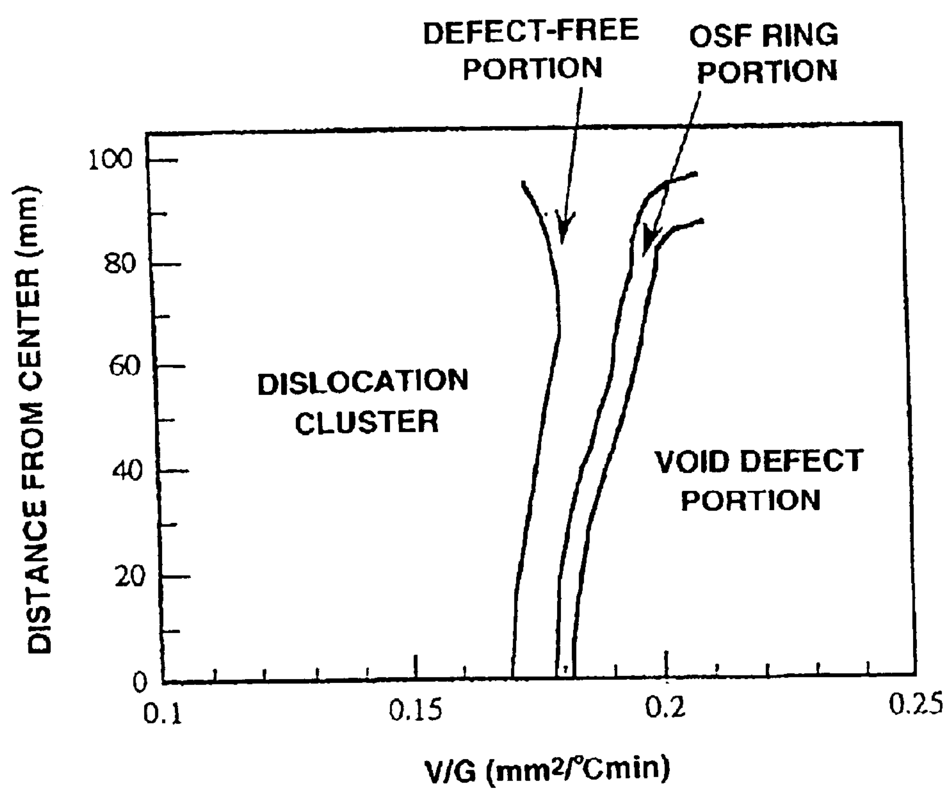
FIG. 12 is a graph of the relation between V/G and the region in which each type of defect is present in the radial direction, for the crystal in FIG. 7.
Figure 13:
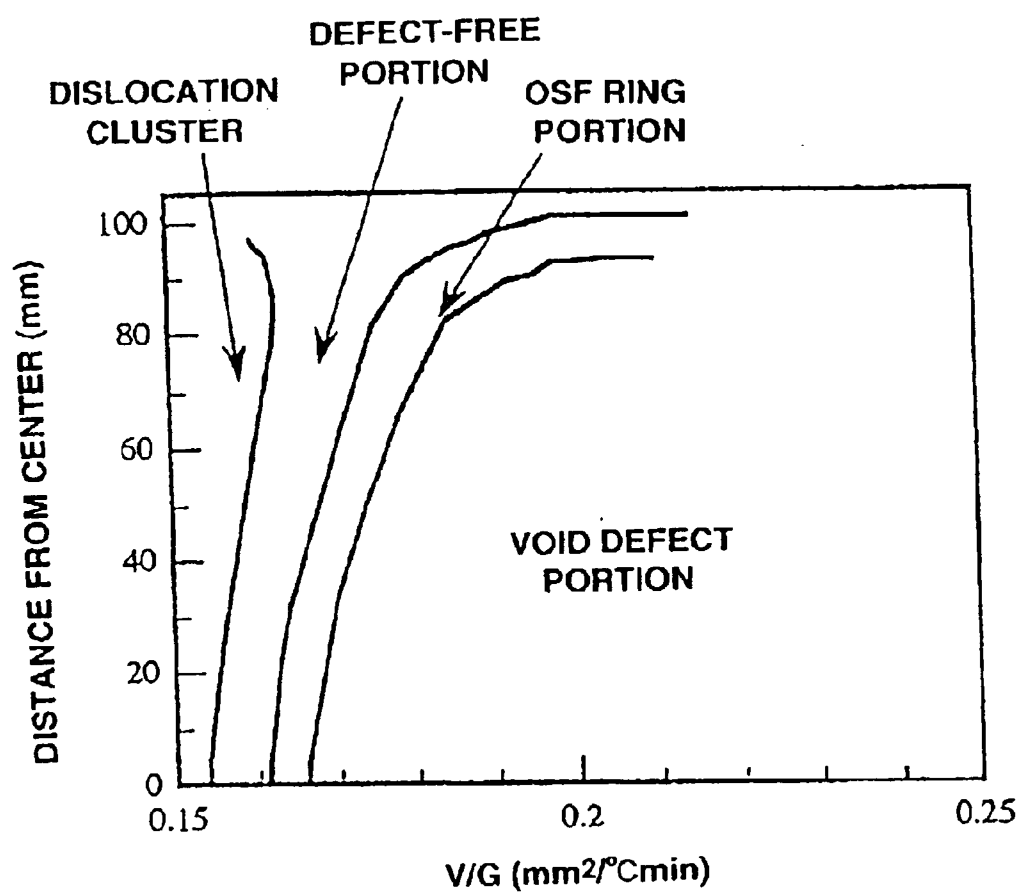
FIG. 13 is a graph of the relation between V/G and the region in which each type of defect is present in the radial direction, for the crystal in FIG. 8.

The combined results of these experiments are given in FIGS. 9 and 10. FIG. 9 shows contour lines for ΔV, where the horizontal axis is the height of the solid-liquid interface, and the vertical axis is G on the crystal side face. The growth of defect-free crystals is possible only within the range indicated by the hatching in FIG. 9, and as for the industrially controllable range, the range indicated by the cross-hatching in FIG. 9 (ΔV>0.01 mm/min) is preferable.

Meanwhile, FIG. 10 shows the contour lines for the average value V of Vosf,min and Vdis,max, where the horizontal axis is the height of the solid-liquid interface, and the vertical axis is G on the crystal side face. It can be seen from FIGS. 9 and 10 that the higher the location of the solid-liquid interface, and the higher the temperature gradient, the faster the defect-free crystals can be pulled up.

When the hatched portion in FIG. 9 is a combination of the height of the solid-liquid interface and the temperature gradient on the crystal side face, [2] defect-free crystals can be obtained by pulling at the growth rate shown in FIG. 10.

As shown in FIGS. 14, 15, and 16, examples of means for adjusting the height of the solid-liquid interface include adjusting the rotational speed of the crystal per unit of time, adjusting the rotational speed of the crucible per unit of time, and adjusting the strength of the magnetic field. As shown in the drawings, the higher the crystal rotational speed is raised, and the higher the crucible rotational speed is raised, and the higher the strength of the horizontally applied magnetic field is raised, the higher the solid-liquid interface will be.

It can be seen from FIGS. 9 and 10 that when the height of the solid-liquid interface is 10 mm or greater, there is a range at which defect-free crystals can be produced at a high pull-up rate and over a wide permissible range for growth rate. Also, it can be seen from FIG. 16 that this solid-liquid interface height can be easily obtained by applying a horizontal magnetic field of 2500 Gauss or greater.

There are many other factors that affect solid-liquid interface height, all of which can be used as control parameters. For instance, the solid-liquid interface height rises when the power is increased to the heater installed at the bottom of the crucible. Also, even if the type of magnetic field is a cusp field, the height of the solid-liquid interface can be controlled just as with a horizontal magnetic field (lateral magnetic field). The height of the solid-liquid interface can also be adjusted by immersing in the crucible a second crucible of smaller diameter than the crucible or a cylindrical quartz tube. In other words, any factor that affects the convection of the melt can be used as a means for adjusting the height of the solid-liquid interface.

The temperature gradient on the crystal side face can be adjusted by adjusting the radiation environment to which the crystal side face are subjected. In other words, the temperature gradient on the crystal side face can be adjusted as desired through the design of the hot zone, including adjusting the distance between the silicon melt 13 and the bottom of the heat shield 23, and installing a heater or cooler as the side face temperature adjusting means 24.

The height of the solid-liquid interface and the temperature gradient on the crystal side face vary gradually as the length of the crystal increases. Therefore, it is preferable to correct and adjust the growth rate slightly as the length increases.

As mentioned above, the temperature distribution within the crystal is determined by the “shape of the solid-liquid interface” and the “temperature distribution on the crystal side face.” The inventors standardized the “shape of the solid-liquid interface” as the concept of the “height of the solid-liquid interface at the crystal center.” Put another way, the inventors expressed the “shape of the solid-liquid interface” in representative fashion by the “height of the solid-liquid interface at the crystal center.” Also, the inventors standardized the “temperature distribution on the crystal side face” as the concept of the “temperature gradient on the crystal side face.” Put another way, the inventors expressed the “temperature distribution on the crystal side face” in representative fashion by the “temperature gradient on the crystal side face.” As discussed above, the inventors indicated that a defect-free region can be easily obtained by setting the conditions using these as parameters.

However, the shape of the solid-liquid interface and the temperature distribution on the crystal side face can come in a variety of types. Here again, though, the tendencies shown in FIGS. 9 and 10 are maintained, with only a slight amount of deviation occurring. Specifically, there is no change at all in the fact that the conditions for producing defect-free crystals can be readily found by the following procedure.

Step 1: First, referring to FIGS. 9 and 10, the desired growth rate and the target for the permissible range of growth rate ($\Delta V$) are determined.

Step 2: The hot zone structure with which the set G on the crystal side face is determined by global heat transfer analysis.

Step 3: A crystal is pulled up in the hot zone determined in Step 2, while the pull-up rate is gradually reduced.

Step 4: The pulled crystal is sliced vertically, and the distribution of defect type is evaluated. The pull-up rate at which a neutral region is created, and the height of the solid-liquid interface near this pull-up rate are also evaluated.

Step 5: The evaluation results from Step 4 are referenced to FIG. 9, a means for adjusting the height of the solid-liquid interface and G on the crystal side face is worked out, and Step 3 is conducted once more.

As discussed above, examples of the means for adjusting the height of the solid-liquid interface include means for adjusting the rotational speed of the crystals, adjusting the rotational speed of the crucible, and adjusting the applied strength of the magnetic field. The temperature gradient on the crystal side face can be also be adjusted by adjusting the radiation environment to which the crystal side face are subjected, as mentioned above.

FIGS. 9 and 10 were drawn for an 8-inch crystal, and therefore cannot be directly applied to 6- and 12-inch crystals. However, the process of using the adjustment of the solid-liquid interface height and the temperature gradient on the crystal side face as the process for finding the conditions under which defect-free crystals can be produced can be applied directly. Therefore, the conditions under which defect-free crystals can be produced can be easily ascertained with the present invention.

[Production of Defect-Free Ingot]

Embodiments will now be given of the production of a defect-free, slender ingot.

<Example of Crystals Grown without a Magnetic Field>

Figure 17:
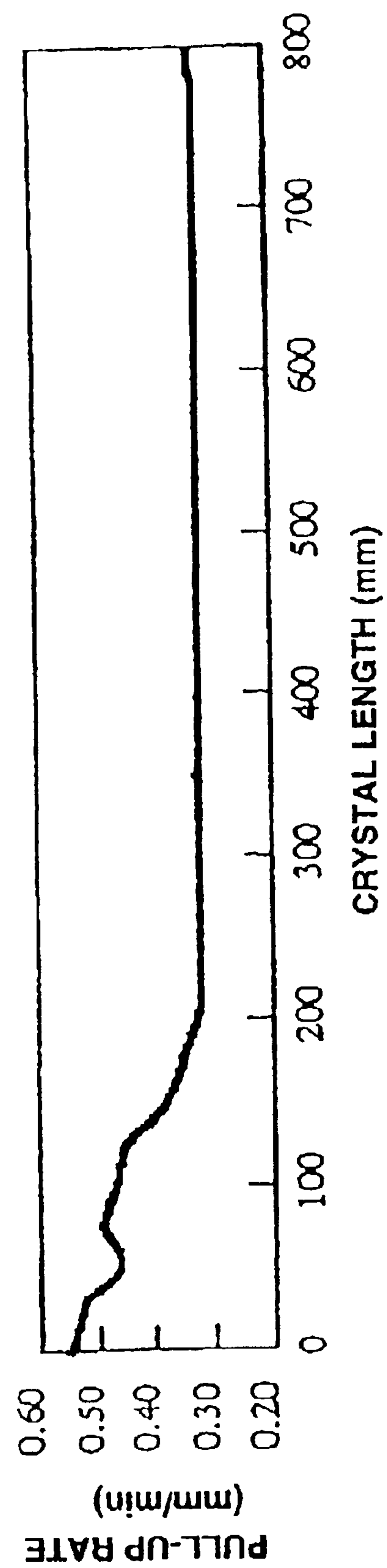
FIG. 17 is a graph of the pull-up rate pattern in the axial direction.

Crystals were pulled up under conditions in which the crystal diameter was 210 mm, the crucible inside diameter was 22 inches, the solid-liquid interface height was −5.7 mm, the temperature gradient on the crystal side face was 2.1° C./mm, no magnetic field was applied, the crystal rotational speed was 12 rpm, and the crucible rotational speed was 12 rpm. The pattern of pull-up rate versus pull-up length was as shown in FIG. 17, and the oxygen concentration was about 28 ppma.

Figure 18:
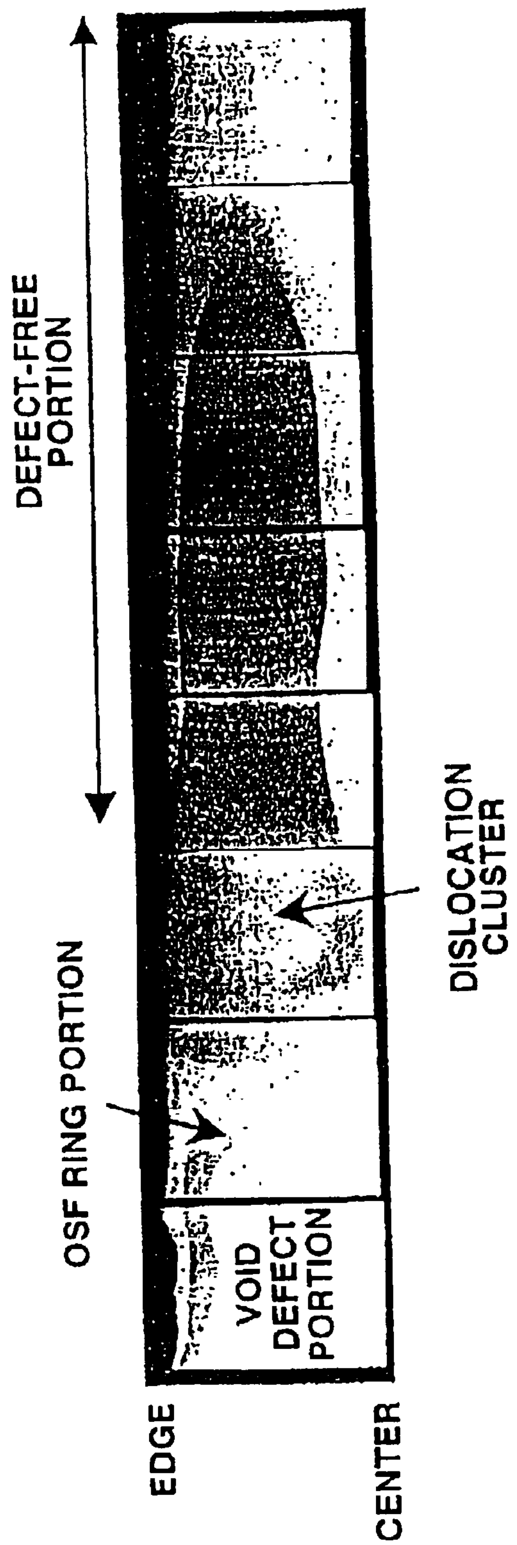
FIG. 18 is an electron data photograph illustrating an X-ray topograph of a defect-free crystal.

FIG. 18 is an X-ray topograph of a sample obtained by slicing the pulled crystal in the lengthwise direction including the crystal axis, then performing a heat treatment for 3 hours at 780° C., plus 16 hours at 1000° C. (oxygen atmosphere).

Figure 19:
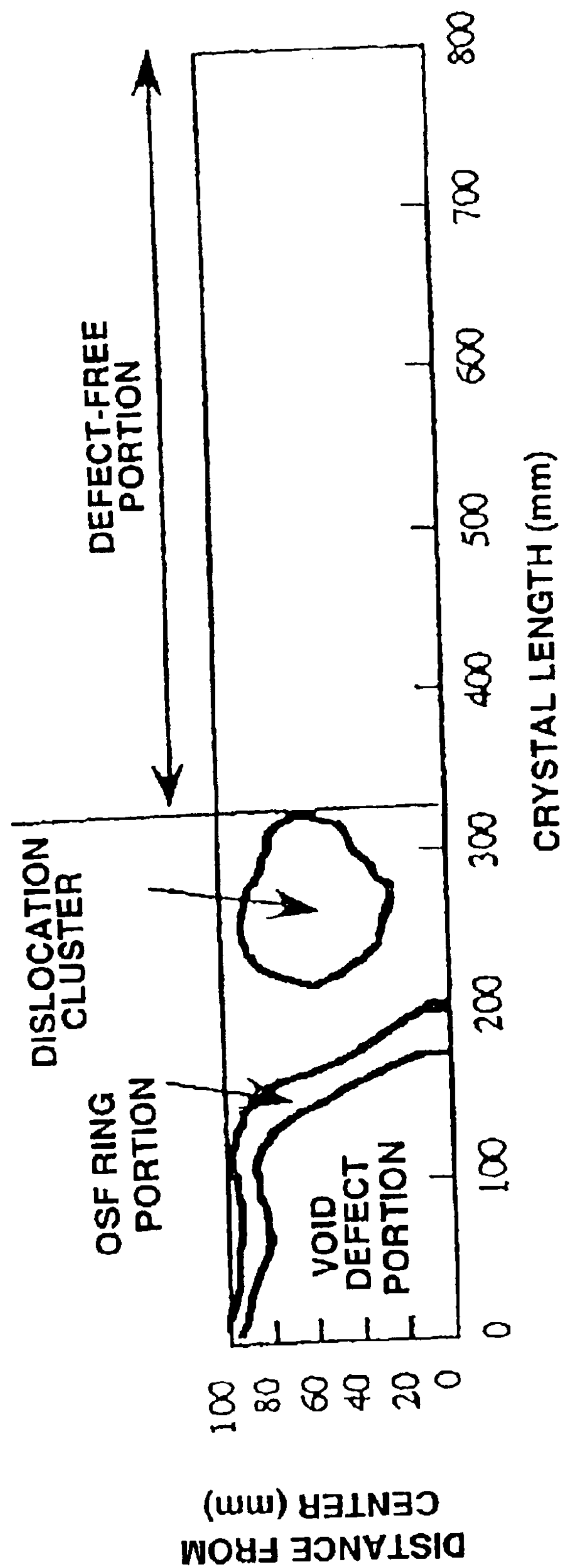
FIG. 19 is a graph of the regions in which each type of defect is present at locations in the lengthwise direction of the crystal and at locations in the radial direction.

The portions that look white and black in the defect-free section correspond to a defect-free region where vacancies are dominant and a defect-free region where interstitial silicon is dominant, respectively. Since the amounts of precipitated oxygen are different, a difference in contrast can be seen. However, both regions are free of defects. FIG. 19 shows the distribution of defect type as a region diagram. It can be seen from FIG. 19 that a defect-free region was obtained over a wide range of the ingot.

With these growth conditions, in FIG. 9 the permissible growth rate $\Delta V$ is located in the positive region, but the $\Delta V$ region is extremely small. The production of crystals under these conditions therefore entails difficulty.

<Example of Crystals Grown with a Magnetic Field Applied>

Figure 20:
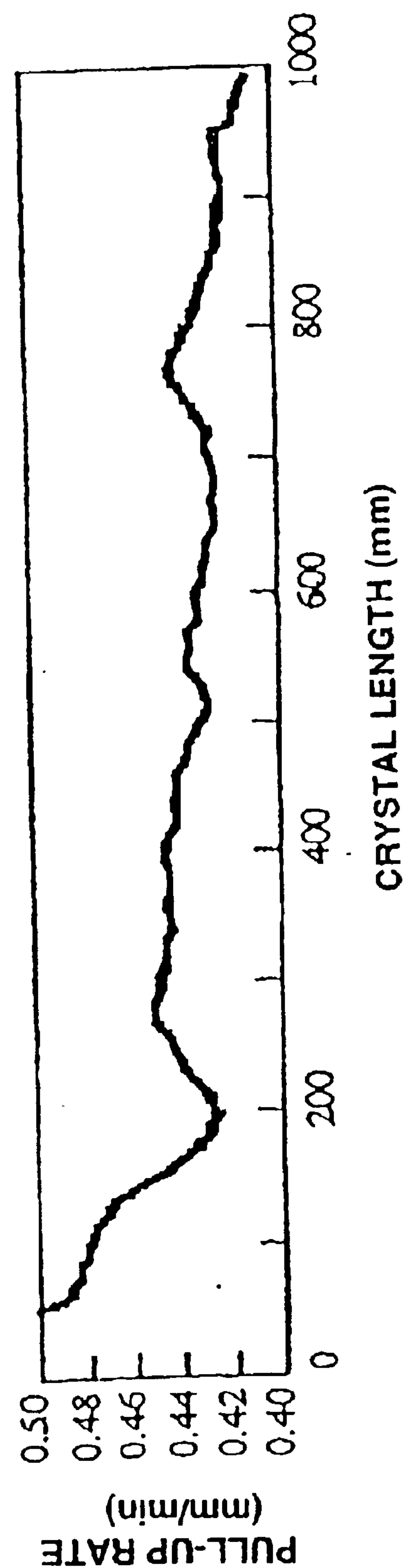
FIG. 20 is a graph of the pull-up rate pattern in the axial direction.

Crystals were pulled up under conditions in which the crystal diameter was 210 mm, the crucible inside diameter was 22 inches, the solid-liquid interface height was ±13.0 mm, the temperature gradient on the crystal side face was 2.82° C./mm, a horizontal magnetic field of 3000 Gauss was applied, the crystal rotational speed was 12 rpm, and the crucible rotational speed was 1.3 rpm in the opposite direction from the crystal rotation. The pattern of pull-up rate versus pull-up length was as shown in FIG. 20, in which the oxygen concentration was about 26 ppma.

Figure 21:
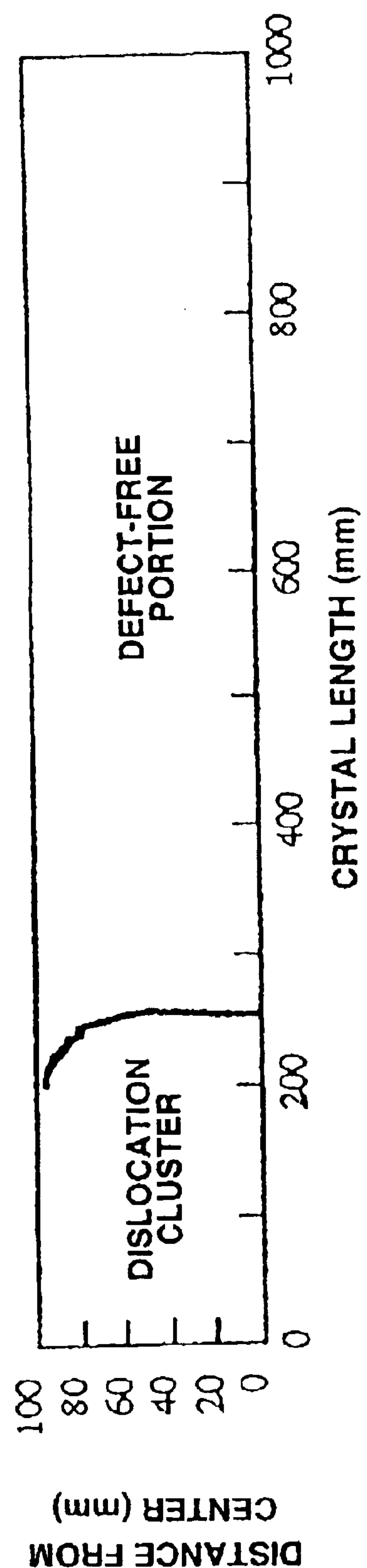
FIG. 21 is a graph of the regions in which each type of defect is present at locations in the lengthwise direction of the crystal and at locations in the radial direction.

FIG. 21 shows the distribution of defect type. It can be seen from FIG. 21 that a defect-free region was obtained over a wide range of the ingot. The pull-up rate at which defect-free crystals were obtained was 0.43±0.01 mm/min. It can be seen in FIG. 9 that with these growth conditions the permissible growth rate $\Delta V$ is positive, and is a large region. Actually, it was extremely easy to produce defect-free crystals under these conditions.

<Example of Growth at Low Oxygen Concentration>

The oxygen concentration in the crystals in FIGS. 9 and 10 is from 24 to 32 ppma (old ASTM, F 121-79), which is currently the practical range for oxygen concentration. However, the inventors discovered that when the oxygen concentration was under 24 ppma, the permissible pull-up rate at which defect-free crystals would be obtained in FIG. 9 expanded, and the growth rate at which defect-free crystals would be obtained also increased. Here again, the producing conditions can be easily ascertained by using the above-mentioned process for finding conditions for producing defect-free crystals. An example of this is given below.

Figure 22:
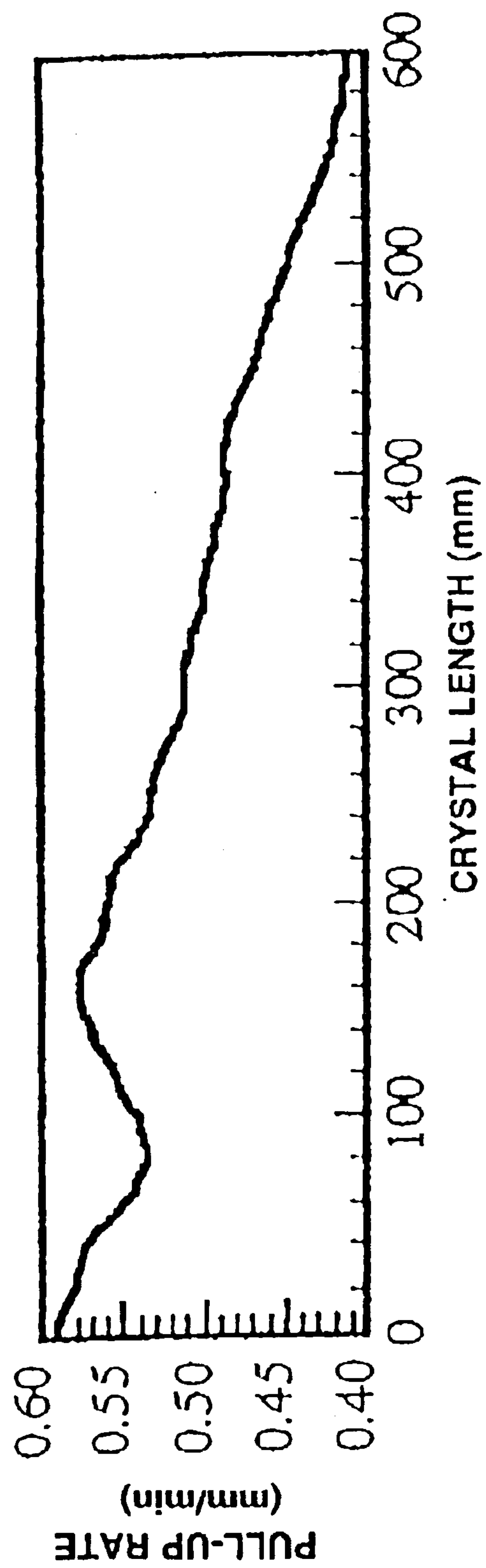
FIG. 22 is a graph of the pull-up rate pattern in the axial direction.

Crystals were pulled up under conditions in which the crystal diameter was 210 mm, the crucible inside diameter was 22 inches, the solid-liquid interface height was 14.0 mm, the temperature gradient on the crystal side face was 2.82° C./mm, a horizontal magnetic field of 3000 Gauss was applied, the crystal rotational speed was 12 rpm, and the crucible rotational speed was 1.3 rpm in the same direction as the crystal rotation. The pattern of pull-up rate versus pull-up length was as shown in FIG. 22, and the oxygen concentration was about 12 to 14 ppma.

Figure 23:
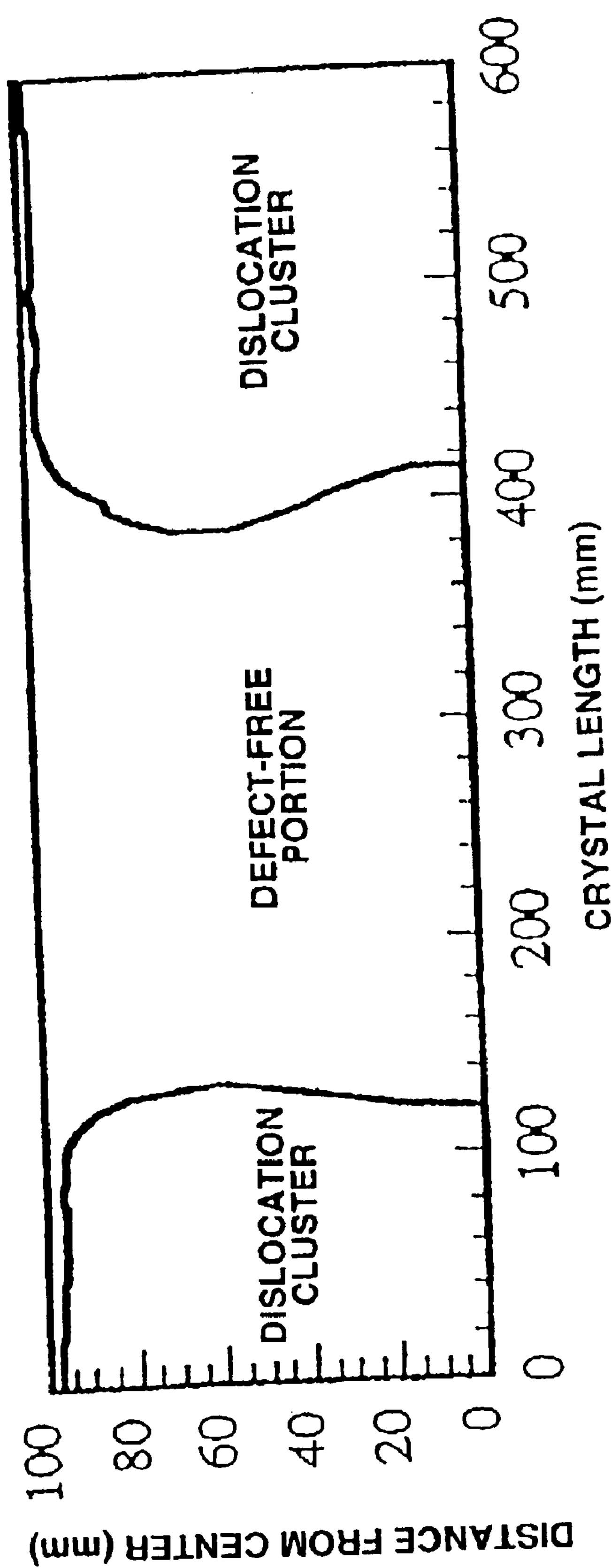
FIG. 23 is a graph of the regions in which each type of defect is present at locations in the lengthwise direction of the crystal and at locations in the radial direction.

FIG. 23 shows the distribution of defect type. It can be seen that a defect-free region was obtained over a wide range of the ingot, and that the pull-up rate at which defect-free crystals could be obtained was high over a range of 0.56 to 0.49 mm/min.

There is a report by Iida et al. that lowering the oxygen concentration raises the rate at which defect-free crystals are generated (M. Lida, W. Kusaki, M. Tamatsuka, E. Lino, M. Kimura, and S. Muraoka ("Defect in Silicon III," Electrochemical Society Proceedings PV 99-1, 1999, p. 499). Also, Sakurada et al. (Japanese Laid-Open Patent Application H11-199386) have shown that when the oxygen concentration is 24 ppma or less, the density at which OSF are generated is extremely low, so it is easy to produce substantially defect-free crystals.

Figure 24:
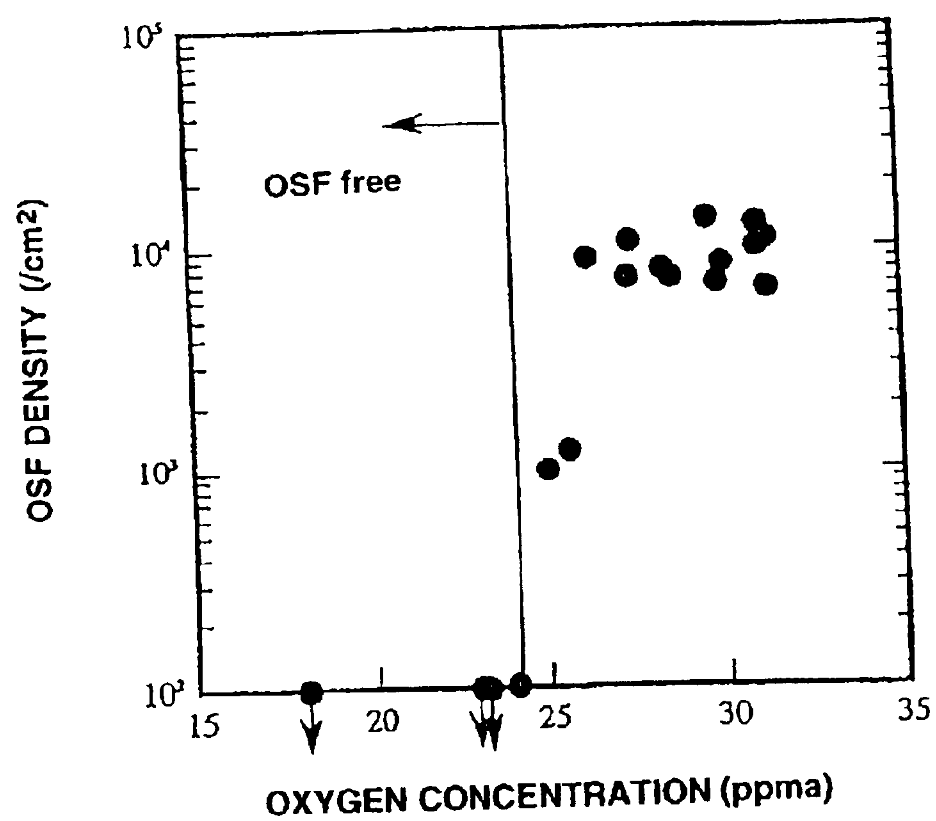
FIG. 24 is a graph of the relation between oxygen concentration and OSF density.
Figure 25A:
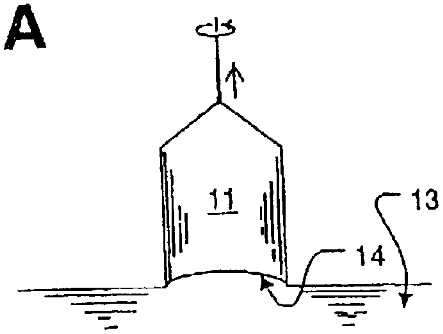
FIG. 25 consists of diagrams illustrating the “shape of the solid-liquid interface”
Figure 25B:
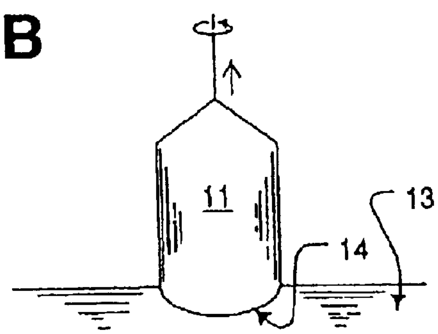
Figure 25C:
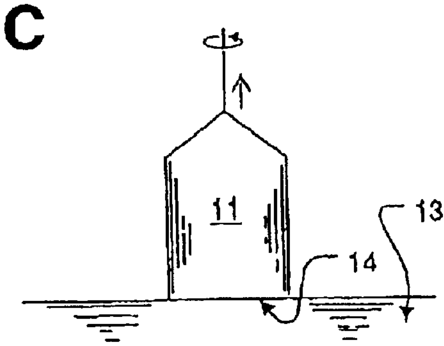
Figure 25D:
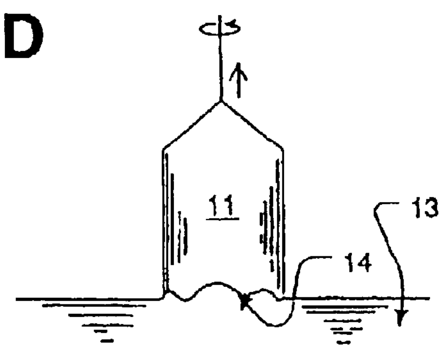
Figure 26A:
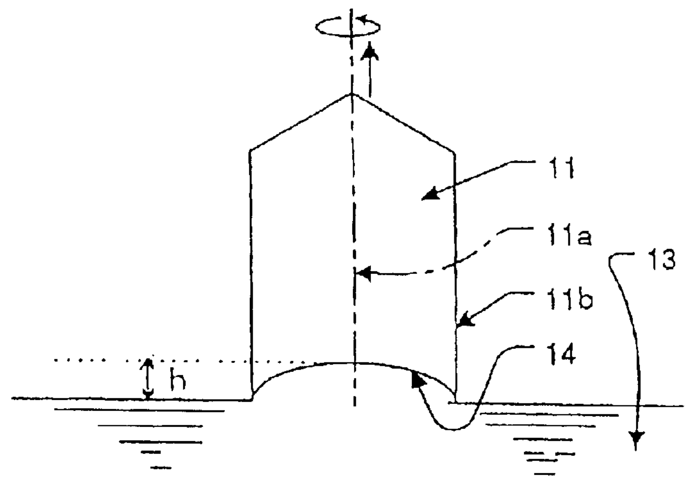
FIG. 26 consists of diagrams illustrating the “height of the solid-liquid interface”
Figure 26B:
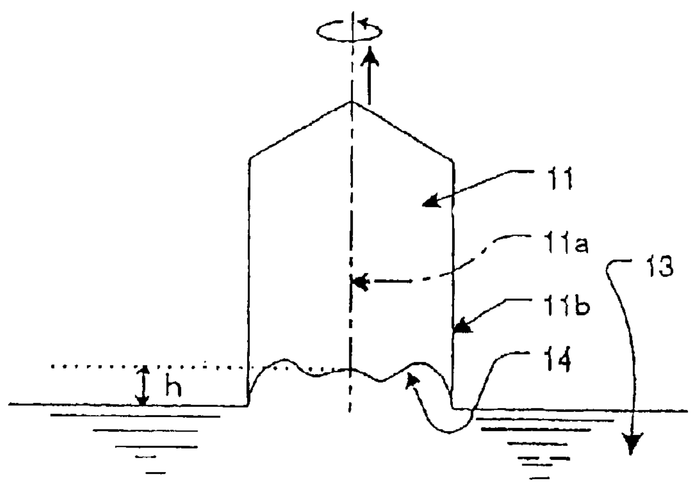
Figure 27:
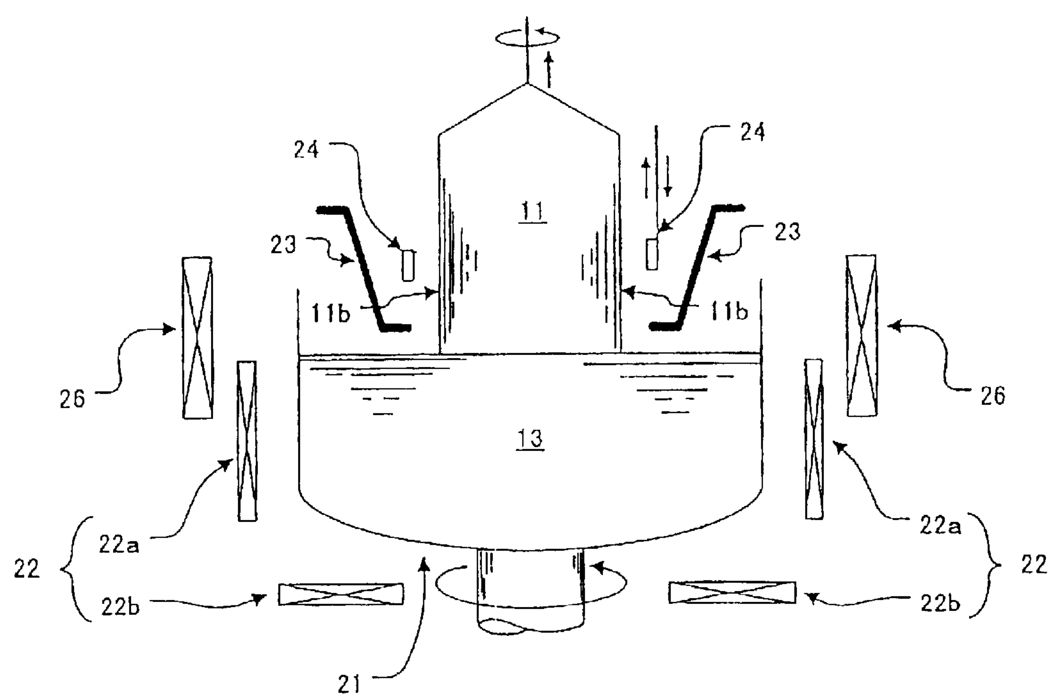
FIG. 27 is a block diagram illustrating the state inside a CZ furnace, giving an example of the means required for implementing the present invention.

For example, FIG. 24 shows the relation between OSF density and oxygen concentration in a heat treatment for 3 hours at 780° C., plus 16 hours at 1000° C. (oxygen atmosphere). It can be seen from FIG. 24 that no OSF occur when the oxygen concentration is under 24 ppma. Since no OSF occur, the pull-up rate range over which a defect-free region is obtained was from Vosf,min to Vdis,max at a high oxygen concentration, but is between the minimum pull-up rate at which void defects occur (Vvoid,min) and Vdis,max, and it can be seen that the range is wider than under high-oxygen conditions, but specific producing conditions cannot be derived from this finding.

It can therefore be said that the present results cannot be derived from these findings, and only with the method of the present invention does it become possible to find specific producing conditions, which were not disclosed at all by previous findings. It can also be said that only with the method of the present invention is it possible to easily find the conditions under which an ingot having a defect-free region over a wide region can be produced stably and with good reproducibility.

INDUSTRIAL APPLICABILITY

As described above, the present invention makes it possible to produce defect-free crystals stably and with good reproducibility by suitably adjusting the relation between the shape of the solid-liquid interface, which is the boundary between a silicon melt and a silicon single crystal, and the temperature distribution on the side face of a single crystal being pulled up, when a silicon single crystal is pulled up from a silicon melt.

With the present invention, regardless of the crystal pulling direction or the wafer plane direction, it is possible to produce an ingot having a defect-free region over a wide region, stably and with good reproducibility. Therefore, because a defect-free region can be formed over a wide region in the crystal pulling direction, more defect-free wafers will be taken from a single ingot, so the present invention is favorable for the mass production of defect-free wafers. Also, because a defect-free region can be formed over a wide region in the wafer plane direction with the present invention, even when a large-diameter ingot is pulled in order to produce a large-diameter wafer (with a diameter of 200 mm or more, for example), an ingot in which all of the planes of this large-diameter wafer are defect-free can be mass produced stably.

For example, with the present invention, even though a certain amount of difficulty may be encountered, it is possible to produce an ingot 55% of which is a region in which all of the wafer planes with a diameter of 200 mm are free of defects, even when no magnetic field is applied (FIG. 19). Also, when a magnetic field (2500 Gauss or greater) is applied, it will be easy to produce an ingot 70% or greater of which is a region in which all of the wafer planes with a diameter of 200 mm are free of defects (FIG. 21).

Furthermore, defect-free crystals with a low oxygen concentration can be produced stably with the present invention. This is also true in the production of a large-diameter wafer with a low oxygen concentration. (See FIG. 23. This allows an ingot 40% or greater of which is a region in which all of the wafer planes with a diameter of 200 mm to be produced with ease).

What is claimed is:

1. A method for producing a silicon ingot by pulling up a silicon single crystal from a silicon melt by the Czochralski method, wherein the height of a solid-liquid interface between a silicon melt and a silicon single crystal at a crystal center of the solid-liquid interface is adjusted by one or more ways selected from a group consisting of adjusting a strength of a magnetic field applied to the silicon melt, adjusting a rotational speed per unit of time of a crucible containing the silicon melt, and adjusting a rotational speed per unit of time of the silicon single crystal, and wherein a temperature distribution on a side face of the silicon single crystal is adjusted, whereby a silicon ingot including a defect-free region is produced.

2. A method for producing a silicon ingot by pulling up a silicon single crystal from a silicon melt by the Czochralski method, wherein the height of a solid-liquid interface between a silicon melt and a silicon single crystal at a crystal center of the solid-liquid interface is adjusted by one or more ways selected from a group consisting of adjusting the strength of the magnetic field applied to the silicon melt to be 2500 Gauss or greater, adjusting a rotational speed per unit of a crucible containing the silicon melt and adjusting a rotational speed per unit of time of the silicon single crystal, and wherein a temperature distribution on a side face of the silicon single crystal is adjusted, whereby a silicon ingot including a defect-free region is produced.

3. A method for producing a silicon ingot by pulling up a silicon single crystal from silicon melt by Czochralski method, wherein the height X of a solid-liquid interface between the silicon melt and the silicon single crystal at a crystal center portion of the solid-liquid interface and temperature gradient on a side face of the silicon single crystal Y are adjusted to be within a range of (1) 1.5° C./mm Y 2.0° C./mm for −20 mm X 0 mm, or (2) 1.5° C./mm Y 0.1X+2° C./mm for 0 mm<X<10 mm, or (3) 0.1X±0.5° C./mm Y 20.2X+1° C./mm for 10 mm X 20 mm, and wherein the method excludes pulling up the silicon single crystal under any of the following single crystal pull-up conditions I to III:

(I) a ratio expressed by V/G is controlled to be in a range from 0.20 to 0.22 $mm^2/°$ C.min, where V(mm/min) is a crystal pull-up rate and G (° C.mm) is an average temperature gradient within the crystal in an axial direction between melting point of silicon and 13000° C.;

(II) an in-plane average G is less than 3° C./mm, less than 1.0° C./mm between $G_{edge}$ and $G_{center}$, V is controlled to be $V_{OSFclose}$ ±0.02 mm/min, average V is controlled to be $V_{OSFclose}$ ±0.01 mm/min, and a magnetic field strength of 2000 G or greater in a horizontal magnetic field is applied, where $G_{edge}$ is an average axial temperature gradient on the crystal side face side, $G_{center}$ is an average axial temperature gradient on the crystal center side, and $V_{OSFclose}$ is the pull-up rate at which OSF rings disappear when the pull-up rate is reduced; and (lII) a V/G value between a crystal center location and a location up to a crystal outer periphery is from 0.16 to 0.18 $mm^{2/°}$ C. min, and $G_{outer}/G_{center}$ is 1.10 or less where V is a crystal pull-up rate (mm/min), G (° C./mm) is an average temperature gradient within the crystal in an axial direction between the melting point of the silicon and 1350° C., $G_{outer}$ is the G value on an outer side face of the crystal, and $G_{center}$ is the G value at a crystal center.

4. The method according to claim 3, wherein the silicon single crystal is pulled at a rate of 0.40 mm/min or higher.

5. The method according to claim 3, wherein the silicon single crystal has an oxygen concentration of 24 ppma or less and a diameter of 200 mm or greater and for 40% or greater (in terms of a ratio of length to overall silicon ingot length) an entire wafer surface is a defect-free region.

* * * * *

UNITED STATES PATENT AND TRADEMARK OFFICE

CERTIFICATE OF CORRECTION

PATENT NO. : 6,869,478 B2
APPLICATION NO. : 10/239593
DATED : March 22, 2005
INVENTOR(S) : Nakamura et al.

It is certified that error appears in the above-identified patent and that said Letters Patent is hereby corrected as shown below:

Column 22, line 54 (Claim 3, line 9)
Please delete "1.5°C./mm Y 2.0°C./mm for -20 mm X 0 mm" and insert --1.5°C./mm ≤ Y ≤ 2.0°C/mm for -20 mm ≤ X ≤ 0 mm--.

Column 22, line 55 (Claim 3, line 10)
Please delete "1.5°C./mm Y 0.1X+2°C./mm for 0 mm <X <10 mm" and insert --1.5°C./mm ≤ Y ≤ 0.1X + 2.0°C/mm for 0 mm ≤ X ≤ 10 mm--.

Column 22, line 57 (Claim 3, line 21)
Please delete "0.1X_0.5°C./mm Y 20.2X+1°C./mm for 10 mm X 20 mm" and insert --0.1X + 0.5°C/mm ≤ Y ≤ 0.2X + 1.0°C/mm for 10 mm ≤ X ≤ 20 mm--.

Column 22, line 64 (Claim 3, line 19)
Please delete "(C.mm)" and insert --(°C/mm)--.

Column 22, line 66 (Claim 3, line 21)
Please delete "13000°C" and insert --1300°C--.

Signed and Sealed this

First Day of July, 2008

JON W. DUDAS
*Director of the United States Patent and Trademark Office*